United States Patent
Nayak

(10) Patent No.: US 7,013,271 B2
(45) Date of Patent: Mar. 14, 2006

(54) METHOD AND SYSTEM FOR IMPLEMENTING A LOW COMPLEXITY SPECTRUM ESTIMATION TECHNIQUE FOR COMFORT NOISE GENERATION

(75) Inventor: Vasudev S. Nayak, Santa Barbara, CA (US)

(73) Assignee: GlobespanVirata Incorporated, Red Bank, NJ (US)

( * ) Notice: Subject to any disclaimer, the term of this patent is extended or adjusted under 35 U.S.C. 154(b) by 558 days.

(21) Appl. No.: 10/161,687

(22) Filed: Jun. 5, 2002

(65) Prior Publication Data

US 2003/0078767 A1    Apr. 24, 2003

Related U.S. Application Data

(60) Provisional application No. 60/305,157, filed on Jul. 16, 2001, provisional application No. 60/297,265, filed on Jun. 12, 2001.

(51) Int. Cl.
*G10L 21/02* (2006.01)
*G10L 13/00* (2006.01)

(52) U.S. Cl. .................. 704/226; 704/226; 704/233; 704/258

(58) Field of Classification Search ............... 704/220, 704/226, 228, 233, 258
See application file for complete search history.

(56) References Cited

U.S. PATENT DOCUMENTS

| | | |
|---|---|---|
| 4,243,950 A | 1/1981 | Proud, Jr. |
| 4,527,798 A | 7/1985 | Siekierski et al. |
| 5,127,053 A | 6/1992 | Koch |
| 5,153,532 A | 10/1992 | Albers et al. |
| 5,381,514 A | 1/1995 | Aso et al. |
| 5,475,712 A | 12/1995 | Sasaki |
| 5,537,509 A | 7/1996 | Swaminathan et al. |
| 5,576,976 A | 11/1996 | White |
| 5,630,016 A | 5/1997 | Swaminathan et al. |
| 5,680,469 A | 10/1997 | Shinozaki |
| 5,722,086 A | 2/1998 | Teitler et al. |
| 5,794,199 A | 8/1998 | Rao et al. |
| 5,809,460 A | 9/1998 | Hayata et al. |
| 5,812,965 A | 9/1998 | Massaloux |
| 5,883,893 A | 3/1999 | Rumer et al. |
| 5,893,056 A | 4/1999 | Saikaly et al. |

(Continued)

FOREIGN PATENT DOCUMENTS

EP   0665530   8/1995

(Continued)

OTHER PUBLICATIONS

ADSP-2100 Family Application Handbook vol. 1, Analog Devices, Inc. 1994, pp. 157-204.*

(Continued)

*Primary Examiner*—Richemond Dorvil
*Assistant Examiner*—V. Paul Harper
(74) *Attorney, Agent, or Firm*—Hunton & Williams LLP

(57) ABSTRACT

A method and system for implementing a low complexity spectrum estimation technique for comfort noise generation are disclosed. Another aspect of the present invention involves segregating filter parameter encoding from an adaptation process for transmission in the form of silence insertion descriptors. A method for implementing a spectrum estimation for comfort noise generation comprises the steps of receiving an input noise signal; approximating a spectrum of the input noise signal using an algorithm over a period of time; detecting an absence of speech signals; and generating comfort noise based on the approximating step when the absence of speech signals is detected; wherein the spectrum of the input noise signal is substantially constant over the period of time.

40 Claims, 18 Drawing Sheets

U.S. PATENT DOCUMENTS

| | | | |
|---|---|---|---|
| 5,978,760 | A | 11/1999 | Rao et al. |
| 5,983,183 | A | 11/1999 | Tabet et al. |
| 6,101,466 | A | 8/2000 | Rao et al. |
| 6,104,992 | A | 8/2000 | Gao et al. |
| 6,108,610 | A | 8/2000 | Winn |
| 6,108,623 | A | 8/2000 | Morel |
| 6,169,638 | B1 | 1/2001 | Morling |
| 6,269,331 | B1 | 7/2001 | Alanara et al. |
| 6,286,122 | B1 | 9/2001 | Alanara |
| 6,289,044 | B1 | 9/2001 | Velez et al. |
| 6,363,127 | B1 | 3/2002 | Heinonen et al. |
| 6,417,730 | B1 | 7/2002 | Segallis et al. |
| 6,420,934 | B1 | 7/2002 | Butler et al. |
| 6,433,633 | B1 | 8/2002 | Hellum |
| 6,439,460 | B1 | 8/2002 | Chang |
| 6,442,380 | B1 | 8/2002 | Mohindra |

FOREIGN PATENT DOCUMENTS

| | | |
|---|---|---|
| EP | 0720146 | 7/1996 |
| EP | 0843301 | 5/1998 |
| JP | 2001094507 | 6/2001 |
| WO | WO 00/31719 | 6/2000 |

OTHER PUBLICATIONS

Rabiner et al. "Digital Processing of Speech Signals," 1978, Prentice-Hall, Inc., pp. 417-447.*

Sen. M. Kuo et al., "A Real-Time Acoustic Echo Cancellation System", IEEE International Conference On Systems Engineering, Aug. 1990, pp. 168-171.

PCT-International Search Report dated Oct. 1, 2002, for Appliaction No. PCT/US02/18537, filed Jun. 12, 2002.

Al-Bayati A K S et al, ., "Novel Design Of A Simple and Accurate White Gaussian Noise Generator", Int. J. Electronics, Taylor and Francis Ltd., London, GB, Feb. 1, 1991, vol. 70, No. 2, pp. 321-326.

PCT-International Search Report dated Oct. 24, 2002 for Application No. PCT/US02/18536, filed Jun. 12, 2002.

Jinseok Koh, "Adaptive Noise Shaping ADC Based on LMS Algorithm," ESSCIRC 2000, 26$^{th}$ European Solid-State Circuits Conference Stockholm, Sweden, Sep. 19-21, 2000, 4 pages.

* cited by examiner

METHOD AND SYSTEM FOR IMPLEMENTING A LOW COMPLEXITY SPECTRUM ESTIMATION TECHNIQUE FOR COMFORT NOISE GENERATION

CROSS REFERENCE TO RELATED APPLICATIONS

This application claims priority from provisional applications Ser. No. 60/297,265, filed Jun. 12, 2001 and Ser. No. 60/305,157, filed Jul. 16, 2001, which are incorporated by reference in their entirety.

FIELD OF THE INVENTION

The present invention relates generally to signal spectrum estimation and, more particularly, to a method and system for estimating signal spectrum and generating comfort noise with less complexity.

BACKGROUND OF THE INVENTION

Digital Subscriber Line (DSL, Digital Subscriber Loop, xDSL) involves a technology that enables high-speed transmission of digital data over traditional copper telephone lines. This technology involves digital telecommunications protocols designed to allow high-speed data communication over existing copper telephone lines between end-users and telephone companies.

When two conventional modems are connected through the telephone system (e.g., Public Switched Telephone Network (PSTN)), the communication may be treated the same as voice conversations. This has the advantage that there is no investment required from the telephone company (telco) but the disadvantage is that the bandwidth available for the communication is the same as that available for voice conversations, usually 64 kb/s (DSO) at most. The twisted-pair copper wires into individual homes or offices can usually carry significantly more than 64 kb/s, provided the telco handles the signal as digital rather than analog.

There are many implementations of the basic scheme, differing in the communication protocol used and providing varying service levels. The throughput of the communication can be anything from about 128 kb/s to over 8 Mb/s, the communication can be either symmetric or asymmetric (i.e., the available bandwidth may or may not be the same upstream and downstream). Equipment prices and service fees also vary considerably.

In many different kinds of modem telecommunications equipment, an important element is a voice processing subsystem, which may perform such functions as transcoding, Dual Tone Modulation Frequency (DTMF) processing, echo cancellation, etc. Examples of equipment requiring voice processing of this kind include everything from speakerphones, to Global System for Mobile communications (GSM) basestations, to broadband integrated access devices. Voice processing subsystems may be Digital Signal Processing (DSP) based and feature a set of algorithm implementations in software. These algorithms may be hand-coded in assembly-code form by algorithmic and DSP-programming experts. Also, an easy way to combine the required algorithms in the required combinations and then interface to the voice processing subsystem through a simple external interface is desired.

Voice over Digital Subscriber Line (VoDSL) involves leveraging copper infrastructure to provide quality voice services and support a wide variety of data applications over an existing line to a customer. VoDSL implements DSL platform in conjunction with platform adaptations that enable voice services. It further gives data competitive local exchange carriers (CLECs) a way to increase revenue potential, incumbent local exchange carriers (ILECs) an answer to the cable modem, and interexchange carriers (IXCs) a way to gain access to the local voice loop. Thus, any carrier type may increase the value of services available through VoDSL.

Generally, VoDSL involves a voice gateway, an integrated access device (IAD), among other components. The voice gateway may provide voice packets that are depacketized and converted to a format for delivery to a voice switch or other similar device. The voice gateway may enable traffic to be accessed from a data network and forwarded to PSTN for service and switching. The IAD may serve as a DSL modem and perform other functionality. The IAD may serve as an interface between a DSL network service and a customer's voice and data equipment. The IAD may provide the interface between the DSL network service and a customer's network equipment. Further, an IAD may be used to connect voice and data enabled equipment.

VoDSL may also be transmitted via Internet Protocol (IP). VoIP may be defined as voice over Internet Protocol, which includes any technology that enables voice telephony over IP networks. Some of the challenges involved with VoIP may include delivering the voice, fax or video packets in a dependable manner to a user. This may be accomplished by taking the voice or data from a source where it is digitized, compressed due to the limited bandwidth of the Internet, and sent across the network. The process may then be reversed to enable communication by voice. VoIP enables users, including companies and other entities, to place telephony calls over IP networks, instead of PSTN.

A consideration associated with the use of VoDSL, VoIP and other voice applications involves silence suppression which may be used to enhance bandwidth and throughput. Silence suppression removes the necessity of packetizing the silence portion of a phone conversation (e.g., when no one is talking). To optimize bit-rates in simultaneously transmitting voice and data information, a voice signal detector detects silence portions of the speech signal. Rather than transmit the silence portion of the voice signal, data (e.g., silence insertion descriptor) may be inserted into the packet stream thereby recovering bandwidth that would otherwise be allocated for voice traffic. While providing effective bit-rate reduction, the deletion of background noise that typically accompanies the "silence" portions of the voice data has the undesired effect on the person receiving and listening to the voice data of absolute silence and the perception of on/off transmission rather than a continuous connection.

In conjunction with silence suppression, comfort noise generation may be implemented to reconstruct or construct and replace the silence part of speech and other voice signals. A drawback associated with conventional comfort noise generators is that they require a large MIPS (million instructions per second) and memory capacity and reduce efficiency and effective voice transmission.

Existing International Telecommunications Union (ITU) recommendation G. series G729AB uses a simpler approach for the gaussian noise generation, which has the drawback of periodicity. Other generators are more MIPS intensive and are not generally suitable for real time systems or the complexity is not warranted.

Gaussian white noise generators may be implemented in applications involving synthesizing speech and other voice signals. One of the ways in which the gaussian generator may be implemented may include using a central limit theorem on a uniform random generator. However, this has a drawback of periodicity especially when dealing with the long-term generation of constant amplitude speech, noise signal or other applications. Other generators are more MIPS intensive and are not generally suitable for real time systems or the complexity is not warranted.

Typically there are very tight latency requirements on telecommunications devices, as excessive latency degrades the quality of a telephone conversation. Consequently, signal processing algorithms used in telecommunications often have to execute on very small blocks of voice data. For example, in VoDSL Customer Premise Equipment (CPE), the Digital Signal Processor operates on 4 sample blocks of 8 kHz data.

An advanced feature of voice compression in voice over data network systems is adaptive silence compression and reconstruction. One aspect of this feature is that a simulated background noise signal is generated by filtering white gaussian noise with a filter intended to spectrally shape the noise to closely match a 'true' background noise, which was not transmitted in order to save bandwidth.

The filter coefficients, however, do not necessarily contain the correct gain, so the resultant signal is not the same power as the true background noise. Also the excitation to the filter generally has some gain which causes the output to be of a different gain from that of the true background noise. In addition, an efficient generation of the simulated signal may only generate four samples at a time, making it difficult (and computationally expensive, given that this function is called approximately 2000 times per second) to measure the signal strength and compensate the gain accordingly.

Therefore, there is a need in the art of VoDSL and VoIP for a more efficient method and system for transmitting voice signals.

SUMMARY OF THE INVENTION

Aspects of the present invention overcome the problems noted above, and realize additional advantages. One such inventive aspect provides methods and systems for implementing a low complexity spectrum estimation technique for comfort noise generation. One aspect of this invention is the manner of estimating the signal spectrum and generating comfort noise (CN) with reduced complexity as compared to existing methods. Another aspect of this invention involves segregating filter parameter encoding from the adaptation process for transmission in the form of silence insertion descriptors. In systems where MIPS and memory are expensive, the invention employs a method, which utilizes the fact that the signal spectrum essentially stays constant over an extended period of time and the method adapts to the spectrum over time. This has an advantage in that the comfort noise generated is a more realistic representation of the input noise and the comfort noise generated is uniform. The segregation of filter parameter encoding for transmission offers enhanced flexibility as such a separation leads to greater interoperability between various systems. Another benefit is that the MIPS and memory are more efficiently used.

Further, existing ITU recommendation G. series G729AB uses a different approach for comfort noise generation (CNG), which approach requires a high level of MIPS and memory. Various other implementations for CNG exist. This inventive aspect of the present invention has, for example, one or more of the following advantages over such approaches: a more pleasing colored comfort noise (as opposed to white) is generated; a less complex algorithm is utilized having a reduced demand for MIPS and memory, which are critical elements in real time systems; and filter parameter encoding (into reflection coefficients) is done independent of the adaptation process, which affords greater flexibility of using the MIPS only when necessary, which allows the filter parameters to be encoded into some other form of encoding, while the fundamental algorithm remains the same (the only change would be to the encoding algorithm).

According to an exemplary embodiment of the present invention, a method for implementing a spectrum estimation for comfort noise generation comprises the steps of receiving an input noise signal; approximating a spectrum of the input noise signal using an algorithm over a period of time; detecting an absence of speech signals; and generating comfort noise based on the approximating step when the absence of speech signals is detected; wherein the spectrum of the input noise signal is substantially constant over the period of time.

In accordance with other aspects of this exemplary embodiment of the present invention, the method further comprises the step of approximating further comprising the step of shaping the input noise to a spectrum of a predicted signal using an inverse predictor; the step of performing an internal check to ascertain that the input noise signal is within approximately 6 dB of a noise floor, wherein approximating to at least one of noise spikes and speech segments is prevented; wherein the algorithm is a least mean square algorithm; wherein the algorithm is a leaky least mean square algorithm; wherein the algorithm is a normalized least mean square algorithm; wherein the algorithm is a linear predictive coding algorithm; the step of performing a variable precision calculation of a least mean square error and at least one least mean square coefficient to make the algorithm substantially independent of variations in noise levels; wherein the generated comfort noise is substantially uniform; the step of normalizing the algorithm for making the approximating step substantially independent of signal amplitude variations; the step of segregating filter parameter encoding into at least one reflection coefficients from the approximating step for transmitting at least one silence insertion descriptor; wherein interoperability between systems is enhanced; wherein MIPS and memory are efficiently utilized; the step of approximating further comprises the step of filtering the input noise signal by a synthesis filter; wherein the synthesis filter is defined as follows:

$$H(z) = \frac{1}{\sum_{i=0}^{M} w_i z^{-i}}$$

wherein M represents a number of taps, w represents a predictor coefficient and H is a function of variable z; wherein the synthesis filter is a $10^{th}$ order synthesis filter; wherein the step of approximating further comprises the steps of detecting noise between speech data; adapting to the noise; and creating silence insertion descriptors based on the adapting step when speech is inactive; wherein silence insertion descriptors are generated by converting at least one direct form coefficients to at least one reflection coefficients as represented by:

$$A_{m-1}(z) = \frac{[A_m(z) - B_m(z)k_m]}{[1 - k_m^2]} \quad m = M-1, M-2, \ldots, 1$$

$$B_m(z) = z^{-m} A_m(z^{-1})$$

wherein silence insertion descriptors are decoded by converting at least one reflection coefficients to direct form coefficients as represented by:

$$A_0(z) = B_0(z) = 1$$

$$A_m(z) = A_{m-1}(z) + z^{-1} B_{m-1}(z) k_m \quad m = 1, 2, \ldots, M-1$$

$$B_m(z) = z^{-m} A_m(z^{-1}) \quad m = 1, 2, \ldots, M-1;$$

and wherein the step of approximating further comprises the steps of detecting noise between speech data; adapting to the noise; and generating enhanced noise based on an average spectrum of the input noise signal when speech is inactive.

According to another exemplary embodiment of the present invention, a system for implementing a spectrum estimation for comfort noise generation comprises: a receiver for receiving an input noise signal; an encoder for approximating a spectrum of the input noise signal using an algorithm over a period of time; a detector for detecting an absence of speech signals; and a comfort noise generator for generating comfort noise based on the approximation of the spectrum when the absence of speech signals is detected; wherein the spectrum of the input noise signal is substantially constant over the period of time.

In accordance with other aspects of this exemplary embodiment of the present invention, the encoder further shapes the input noise to a spectrum of a predicted signal using an inverse predictor; an internal check is performed to ascertain that the input noise signal is within approximately 6 dB of a noise floor; wherein approximating to at least one of noise spikes and speech segments is prevented; wherein the algorithm is a least mean square algorithm; wherein the algorithm is a leaky least mean square algorithm; wherein the algorithm is a normalized least mean square algorithm; wherein the algorithm is a linear predictive coding algorithm; wherein a variable precision calculation of a least mean square error and at least one least mean square coefficient is performed to make the algorithm substantially independent of variations in noise levels; wherein the generated comfort noise is substantially uniform; the algorithm is normalized for making the approximation of the spectrum substantially independent of signal amplitude variations; wherein filter parameter encoding into at least one reflection coefficients is segregated from the approximation of the spectrum for transmitting at least one silence insertion descriptor; wherein interoperability between systems is enhanced; wherein MIPS and memory are efficiently utilized; further comprising a synthesis filter for filtering the input noise signal; wherein the synthesis filter is defined as follows:

$$H(z) = \frac{1}{\sum_{i=0}^{M} w_i z^{-i}}$$

wherein M represents a number of taps, w represents a predictor coefficient and H is a function of variable z; wherein the synthesis filter is a $10^{th}$ order synthesis filter; wherein the encoder further comprises a detector for detecting noise between speech data; an adaptor for adapting to the noise; and silence insertion descriptor creator for creating silence insertion descriptors based on the adapting step when speech is inactive; wherein silence insertion descriptors are generated by converting at least one direct form coefficients to at least one reflection coefficients as represented by:

$$A_{m-1}(z) = \frac{[A_m(z) - B_m(z)k_m]}{[1 - k_m^2]} \quad m = M-1, M-2, \ldots, 1$$

$$B_m(z) = z^{-m} A_m(z^{-1})$$

wherein silence insertion descriptors are decoded by converting at least one reflection coefficients to direct form coefficients as represented by:

$$A_0(z) = B_0(z) = 1$$

$$A_m(z) = A_{m-1}(z) + z^{-1} B_{m-1}(z) k_m \quad m = 1, 2, \ldots, M-1$$

$$B_m(z) = z^{-m} A_m(z^{-1}) \quad m = 1, 2, \ldots, M-1;$$

and wherein the encoder further comprises a detector for detecting noise between speech data; an adaptor for adapting to the noise; and a noise generator for generating enhanced noise based on an average spectrum of the input noise signal when speech is inactive.

The accompanying drawings, which are incorporated in and constitute a part of this specification, illustrate various embodiments of the invention and, together with the description, serve to explain the principles of the invention.

LIST OF ACRONYMS

AAL—ATM Adaption Layer
ADSI—Analog Display Services Interface
ADSL—Asymmetric Digital Subscriber Line
AGC—Automatic Gain Control
ASICs—Application-Specific Integrated Circuits
ATM—Asynchronous Transfer Mode
BUN—Broadband Unified Framework
CBR—Constant Bit Rate
CIDCW—Caller Identifier On Call Waiting
CLECs—Competitive Local Exchange Carriers
CN—Comfort Noise
CNG—Comfort Noise Generation
CO—Central Office
CO/DLC—Central Office/Digital Loop Carrier
CPCS—Common Part Convergence Sublayer
CPE—Customer Premise Equipment
CRC—Cyclic Redundancy Check
CS-ACELP—Conjugate-Structure Algebraic-Code-Excited Linear-Predictive
DLCI—Data Link Connection Identifier
DSL—Digital Subscriber Line
DSL PHY—Digital Subscriber Line Physical Layer Device
DSLAM—Digital Subscriber Line Access Multiplexer
DSP—Digital Signal Processing
DSVD—Digital Simultaneous Voice and Data
DTM—Dual Tone Modulation DTMF—Dual Tone Modulation (or Multi) Frequency
ECSR—Echo Canceller with Single Reflector
EEPROM—Electrically Erasable Programmable Read Only Memory
EPD—Early Packet Discard
GSM—Global System for Mobile
IAD—Integrated Access Device
IADs—Integrated Access Devices
IETF—Internet Engineering Task Force
ILECs—Incumbent Local Exchange Carriers
IMA—Inverse Multiplexing over ATM
IP—Internet Protocol
ISOS—Integrated Software On Silicon™
ISP—Internet Service Provider
ITU—International Telecommunications Union
IXCs—Interexchange Carriers
L—Length
LMS—Least Mean Square
MIPS—Million Instructions Per Second
NAT—Network Address Translation
NLMS—Normalized Least Mean Square
NRT—Non Real Time
OAM—Operations and Management
OSI—Open Systems Interconnection
PBX's—Private Branch Exchange's
PC—Personal Computer
PCP/IP—Transmission Control Protocol on top of the Internet Protocol
PDU—Protocol Data Unit
PPD—Partial Packet Discard
PPoA—Point to Point Protocol over ATM
PPPoE—Point to Point Protocol over Ethernet
PPTP—Point Tunneling Protocol
PSTN—Public Switched Telephone Network
RMS—Root Mean Square
RT—Real Time
RTP—Real-Time Transport Protocol
SDRAM—Synchronous Dynamic Random Access Memory
SDSL—Symmetric Digital Subscriber Line
SF—Scale Factor
SID—Silence Insertion Descriptors
SNMP—Simple Network Management Protocal
SOHO—Small Office/Home Office
SSCS—Service Specific Convergence Sublayer
SVCs—Switched Virtual Circuits
UNI—User Network Interface
USB—Universal Serial Bus
V—Volt
VAGC—Voice Activity Detection with Automatic Gain Control
VBR—Variable Bit Rate
VoDSL—Voice over Digital Subscriber Line
VPI/VCI—Virtual Path Identifier/Virtual Channel Identifier
WAN—Wide Area Network

BRIEF DESCRIPTION OF THE DRAWINGS

The present invention can be understood more completely by reading the following Detailed Description of the Invention, in conjunction with the accompanying drawings, in which.

DETAILED DESCRIPTION OF THE INVENTION

The following description is intended to convey a thorough understanding of the invention by providing a number of specific embodiments and details involving VoDSL and VoIP applications. It is understood, however, that the invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending upon specific design and other needs.

According to an embodiment of the present invention, a low complexity spectrum estimation technique for comfort noise generation may be provided. A comfort noise generator (CNG) may be implemented to compress and reconstruct the silence part of speech signals. CNG may work with any voice activity detector, an echo canceller or other similar device to compress silence or generate comfort noise. The present invention provides a simplified technique for estimating a signal spectrum to generate comfort noise.

One aspect of the present invention involves estimating the signal spectrum and generating comfort noise (CN) with less complexity as compared to existing methods. Another aspect of the present invention may involve the segregation of filter parameter encoding from an adaptation process, for transmission in the form of silence insertion descriptors.

In systems where Million Instructions Per Second (MIPS) and memory are expensive, the method of the present invention utilizes the fact that the signal spectrum essentially stays constant for an extended period of time where the method may adapt to the spectrum over a predetermined period of time. As a result, the comfort noise may be generated as a more realistic representation of the input noise. Further, the comfort noise generated may be more uniform.

According to another embodiment of the present invention, the segregation of filter parameter encoding for transmission may offer enhanced flexibility. For example, greater interoperability between various systems may be recognized. In addition, the MIPS and memory may be efficiently used.

The present invention may generate a more pleasing colored comfort noise (as opposed to white, for example). The present invention may involve a less complex algorithm and saves MIPS and memory, which are critical elements in real time systems. Filter parameter encoding (into reflection coefficients, for example) may be accomplished independently of the adaptation process, which provides greater flexibility of using the MIPS only when necessary. In another example, if the filter parameters are to be encoded into some other form of encoding, the fundamental algorithm may remain constant or essentially the same. Thus, in this example, the only change would be to the encoding algorithm.

Figure 1:
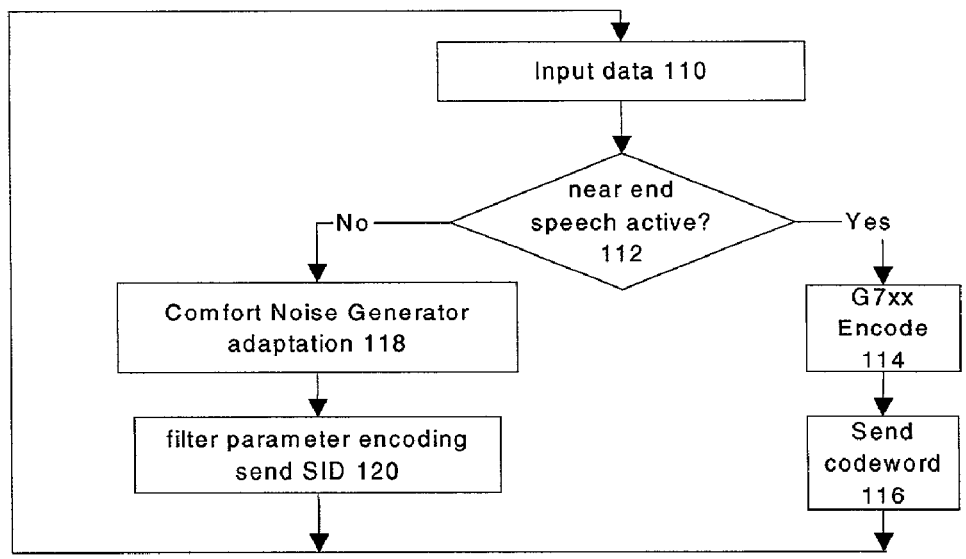
FIG. 1 is a flowchart illustrating an example of an encoder, according to an embodiment of a first aspect of the present invention.

FIG. 1 illustrates a flowchart of an encoder, according to an embodiment of the present invention. This mode of operation may be used when a vocoder (or other similar device) may not have associated or built-in silence compression capacity. To improve the compression of the system, CNG may adapt to the background noise perceived between portions of speech data and create silence insertion descriptors (SID) representative of characteristics of the perceived noise, when the speech is inactive, as illustrated in FIG. 1.

Figure 15:
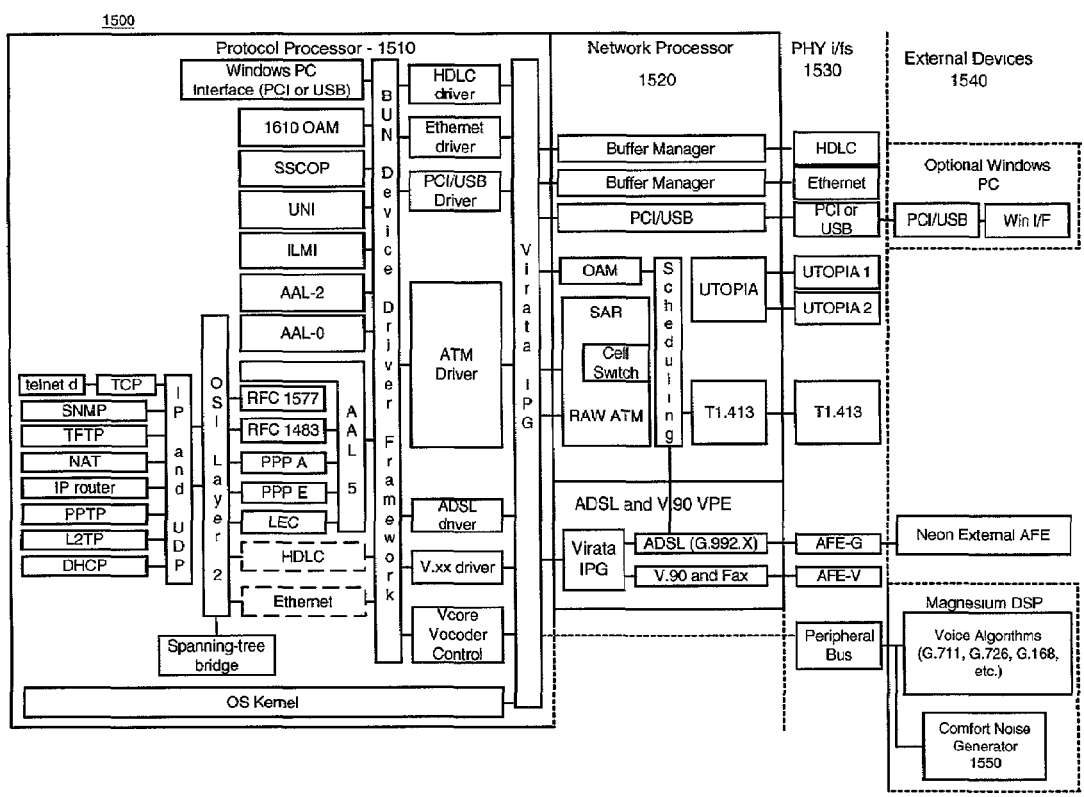
FIG. 15 is a schematic drawing of a software architecture in which the inventive aspects of the present invention may be incorporated.

Input data, including voice and silence/background data, is received, at step 110. At step 112, "near end" speech activity, i.e., that portion of speech or voice data at the front end or beginning of the voice/speech data, is determined. If a positive response is elicited, then G7xx encoding occurs, at step 114. Further, codeword data is sent to the channel (transmitted to the decoder) at step 116, and the state of the system may be returned to receive input data, at step 110. If a negative response is elicited, Comfort Noise Generator adaptation occurs, at step 118. Filter Parameter encoding then sends SID to the channel (transmitted to the decoder), at step 120, and the state of the system may then be returned to receive input data, at step 110. In short, FIG. 1 illustrates a manner in which the input data may be classified as speech or silence and accordingly where speech codeword or SID are sent respectively to the channel to be transmitted to the decoder. The system of FIG. 1 may be used in section 1540 of a DSP chip, as shown in FIG. 15, as discussed below.

Figure 2:
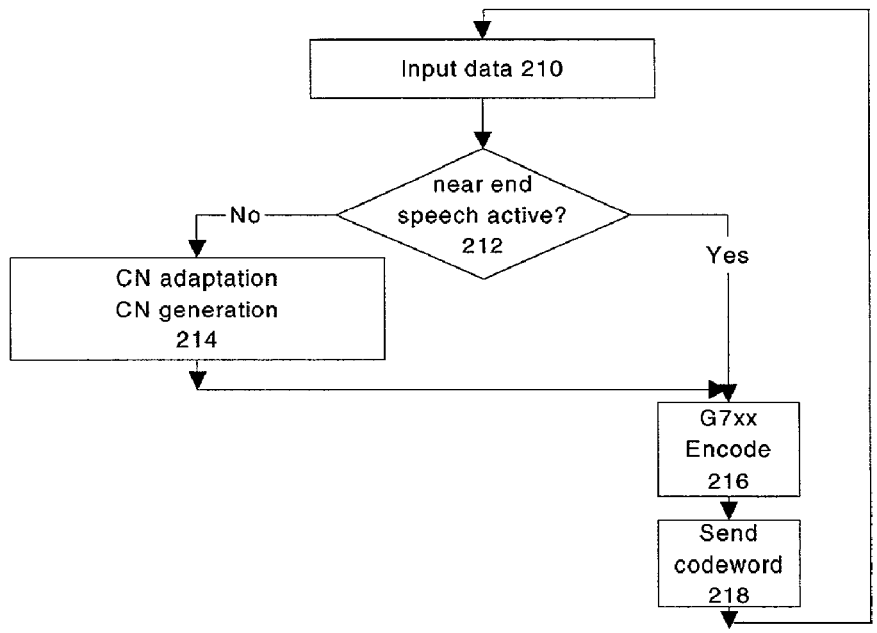
FIG. 2 is a flowchart illustrating another example of an encoder, according to an embodiment of the first aspect of the present invention.

FIG. 2 illustrates a flowchart of an alternative encoder when SID is not sent, according to another embodiment of the present invention. The system of FIG. 2 may be implemented in section 1540 of a DSP chip, as shown in FIG. 15, as discussed below. When near end speech is inactive, CNG adapts and generates noise, which may be encoded by a vocoder. This mode may be used when residual echo and noise combination is perceptually unpleasant. CNG may generate perceptually enhanced noise based on the average spectrum of the input.

Input data may be received at step 210. At step 212, it may be determined whether near end speech is active or not. If near end speech is inactive, comfort noise may be adapted and generated, as illustrated at step 214. G7xx encoding may occur at step 216. Further, codeword data may be sent and forwarded to input data, at step 210.

According to an embodiment of the present invention, a comfort noise generation algorithm may be implemented to approximate the spectrum of an input noise using a Least Mean Square (LMS) function, for example. However, other functions, such as Normalized Least Mean Square (NLMS) or Linear Predictive Coding (LPC) may be implemented. The adaptation may utilize the fact that an inverse predictor shapes the input white noise to the required spectrum of the predicted signal. This adaptation may then be used to generate noise whenever speech is not present. As the spectrum of the noise is approximately constant over a period of time, the method of the present invention may produce favorable results, without using more complex signal processing. The individual modules are described in further detail below. To prevent adaptation to noise spikes or speech segments, an internal check may be done to ascertain that the input is within 6 dB (or other predetermined value) of the noise floor.

Empirically a 10th order synthesis filter may be determined to provide a favorable balance between performance and MIPS. Other filters may be implemented in accordance with the present invention. To ensure increased stability of the adaptation, a variant of the LMS algorithm called the Leaky LMS, for example, may be used. Other variants may be implemented in accordance with the present invention. To make the algorithm independent of variations to noise levels within a range (e.g., −30 dBm to −100 dBm), a variable precision calculation of the LMS error and LMS coefficient may be accomplished. In addition, the leaky LMS may be normalized to make the adaptation independent of signal amplitude variations. In the equations below, the value in parentheses refer to the time and variables in bold refer to arrays (e.g., vec(n) refers to values of the array "vec" at time n).

Parameters:

M: number of taps $\mu$: adaptation step size a: positive value n: error at time n Data:
  u(n): M by 1 tap input vector
  w(0): appropriate value if known; 0 otherwise
  d(n): desired response at time n
  e(n): error at time n Computation:

n=0,1,2, $$e(n)=d(n)-w(n)^T u(n)$$

$$w(n+1) = [1 - \mu\alpha]w(n) + \left[\frac{\mu u(n)e(n)}{a + \|u(n)\|^2}\right]$$

$(1-\mu\,\alpha)$ very close to, but less that 1

As the LMS adaptation is essentially a prediction process, the following relations may exist:

If $x_k, \ldots, x_{k-M}$ is the input sample sequence $w(n)$=predictor coefficients: $w_0, \ldots, w_m$ $u(n) = x_{k-1}, \ldots, x_{k-M}$ $d(n) = x_k$ The synthesis filter may be defined by $$H(z) = \frac{1}{\sum_{i=0}^{M} w_i z^{-i}}$$

The white noise may be filtered by the above synthesis filter H(z).

The approximate gain may be calculated by filtering a fixed sequence of noise through the filter and its output gain calculated. This divided by the required gain (the noise floor) gives the ratio to be used while generating the output.

The SID may be generated by converting the direct form to lattice coefficients (e.g., reflection coefficients).

$$A_{m-1}(z) = \frac{[A_m(z) - B_m(z)k_m]}{[1 - k_m^2]} \quad m = M-1, M-2, \ldots, 1$$

$B_m(z) = z^{-m} A_m(z^{-1})$

In the decode function, a reverse operation may be used to convert the reflection coefficients to direct form coefficients.

$$A_0(z) = B_0(z) = 1$$

$$A_m(z) = A_{m-1}(z) + z^{-1} B_{m-1}(z) k_m \quad m = 1, 2, \ldots, M-1$$

$$B_m(z) = z^{-m} A_m(z^{-1}) \quad m = 1, 2, \ldots, M-1$$

The approximate gain calculation may also be performed in the decode function. The method is the same (or similar) as that in adapt.

To ensure that the output is in the telephony/speech band (150 Hz–3400 Hz), the output of a synthesis filter may be filtered through the following band pass filter.

$$H_{bp}(z) = \frac{1 + z^{-1} - z^{-2} - z^{-3}}{1 + 0.473968 z^{-1} - 0.666365 z^{-2} - 0.449734 z^{-3}}$$

According to another embodiment of the present invention, a simple gaussian white noise generator for real time speech synthesis applications may be implemented. In speech synthesis and other applications, a gaussian white noise generator may be implemented. The present invention provides a method and system for using two or more uniform (or substantially uniform) generators to increase the periodicity to be aperiodic for various speech applications. The present invention provides a method and system for generating gaussian random noise with a long period without minimal computation complexity for fixed point and other systems.

When synthesizing speech, a gaussian random noise generator may be implemented. For simplicity, such a sequence may be received from a pseudo random sequence generator and then from a central limit theorem, for example. When the period of the pseudo random generator is limited, as is usually the case, this form of noise generation may lead to audible artifacts due to periodicity especially when synthesizing a stable spectrum signal, for example. The present invention provides a method and system for overcoming this drawback, without compromising the simplicity of the application.

To generate a practically aperiodic signal, two or more different random number generators may be implemented having a period which may be equal to a power of two ($P=2^k$), for example.

Figure 3A:
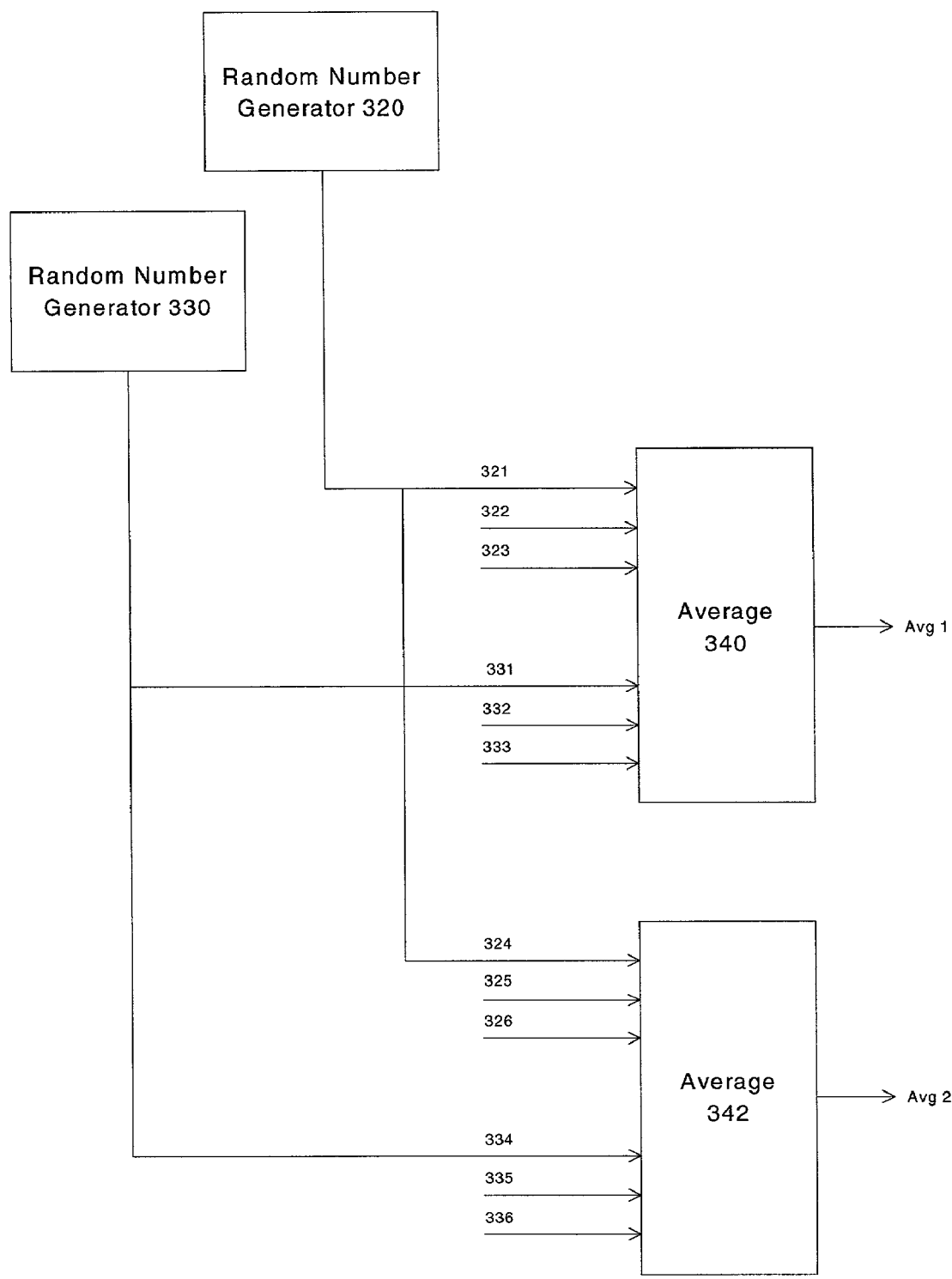
FIG. 3a is an example of a system for implementing multiple generators, according to an embodiment of a second aspect of the present invention.

FIG. 3a is an example of a system for implementing multiple generators in accordance with the present invention. Random number generators may include 16-bit generators where the period may repeat every 65536 times, for example. In this case, the number of inputs may be equal to 6, but may be set at other values. Random Number Generator 320 may include inputs 321, 322 and 323 coupled to an average computing component 340 and 324, 325, 326 coupled to an average computing component 342. Random Number Generator 330 may include inputs 331, 332 and 333 coupled to an average computing component 340 and inputs 334, 335, 336 coupled to an average computing component 342. Average 340 may output an average Avg 1 of inputs 321, 322, 323, 331, 332 and 333. Average 342 may output an average Avg 2 of inputs 324, 325, 326, 334, 335 and 336.

As an example, the following generators have a period of $2^{16}$ and may be implemented in accordance with the present invention.

Generator 1 (e.g., Random Number Generator 320):

a=seed1×31821+13849 seed1=sign extended lower 16 bits of a rand1=seed1

Generator 2 (e.g., Random Number Generator 322):

b=seed2×31421+13849 seed2=sign extended lower 16 bits of b rand2=seed2

As per a central limit theorem, a total of 2*N samples (N samples from each generator) may be averaged to give a single value of the gaussian noise output, as illustrated in further detail below.

$$avg1 = \frac{\sum N \text{ successive values of } rand1}{N}$$

$$avg2 = \frac{\sum N \text{ successive values of } rand2}{N}$$

$$gaussian = \frac{avg1 + avg2}{2}$$

After each period, one of the generator's sample generation may be advanced by one (or other value) so that the period of this generator may be essentially one less than the period of the other generator. The periods of the two generators may now be relatively prime where the periodicity of the generators may be increased to P*(P−1)/(gcd(P,N)*gcd(P−1,N)), where P is the period of the first generator, P−1 is the period of the second generator and gcd(x,y) is the greatest common divisor of the two numbers x,y. This method of the present invention may be generalized to M random generators with various periods.

For example, Random Number Generator 330 may be set so that one sample is discarded thereby throwing the period off by a predetermined amount (e.g., one sample). As a result, Random Number Generator 330 may repeat every 65535 times while Random Number Generator 320 may repeat every 65536 times. Avg 1 and Avg 2 may be used to compute a gaussian value which produces an improved sounding background noise. This may be a result of discarding one sample from a generator (e.g., 330) thereby minimizing an audible artifact due to periodicity. For example, if a second generator (e.g., 330) is not implemented with a different period than a first generator (320) in accordance with the present invention, a resulting audible repeat may be perceived at approximately 1.2 seconds, for example. The present invention may be implemented to essentially eliminate (or minimize) this audible repeat.

Figure 3B:
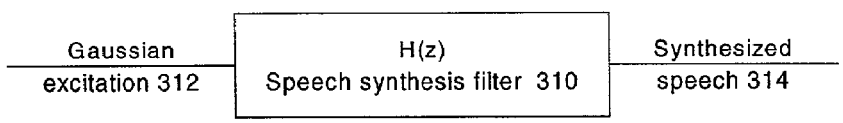
FIG. 3b is a block diagram illustrating an example of a speech synthesis filter, according to an embodiment of a second aspect of the present invention.

Excitation of the speech synthesis filter may be formed to generate speech, as illustrated in FIG. 3b. Gaussian excitation signal 312 may be filtered by Speech Synthesis filter 310 to generate a filtered signal, as represented by Synthesized speech, at filter output 314.

As an example, the following instance at a sampling rate of 8000 Hz may be compared. In an example, P may be equal to 65536 and N may be equal to 6. The period of the generator may be about 24 hours, whereas the period of each of the gaussian generators taken individually would be approximately 2 seconds.

According to yet another embodiment of the present invention, colored comfort noise generation (CNG) in absence of SID packets containing spectrum information may be provided.

In voice communications systems, where the bandwidth utilization of a voice call is to be minimized, voice activity detection and silence compression or elimination may be used to decrease the bandwidth otherwise required for non-voice segments of a conversation. Bandwidth may be saved by sending little or no information about the non-voice audio. Such information may be transmitted in a SID packet.

Currently, when no spectral information is transmitted, white noise may be generated, which may be unpleasant to hear because white noise often has no relation to the compressed or non-transmitted, non-voice background noise. This results in perceptible incongruities. On the receiving end of the conversation, the silence may be synthesized. If spectral information associated with the non-voiced background signal is not transmitted, the synthesized background signal typically does not have the same spectral characteristics of the true background noise. This may cause unpleasant sounding differences in the background noise when someone is speaking versus when they are not speaking. The present invention provides a method and system to overcome the aforementioned problems. In particular, the present invention provides a method and system for generating colored comfort noise in absence of SID packets containing spectrum estimation.

Some silence compression schemes may enable the transmission of information describing spectral characteristics of the background noise. Other techniques may only provide the background noise power level, or no information whatsoever about the background noise. When the spectral information is not contained in the SID, the decoder has no information from which to generate spectrally adaptive background noise. There are various system design considerations that may prevent spectral information from being contained in the SID. Considerations may include low complexity and interoperability, among others. For example, low complexity considerations may involve the simplicity of the equipment on the transmitting side that prevents or greatly limits the generation of SIDs containing spectral information. In another example, interoperability considerations may involve several standards that may exist in which there are well-defined SIDs which may contain background noise power, or minimum or no information about the background noise.

The present invention provides a method and system for generating colored noise reflecting the spectrum of the actual noise in the absence of SID packets containing spectral information. The low complexity spectrum estimation technique for CNG discussed above may be implemented to generate the comfort noise, for example.

The present invention provides a method and system for utilizing information content in the speech and the transition hangover between speech and noise, on the decoder side to generate comfort noise. This adaptation to noise may be accomplished using various algorithms of estimating the spectrum of color noise. According to an embodiment of the present invention, an adaptation algorithm may be implemented that adapts with time, rather than a block based algorithm to prevent the repeated generation of artifacts present in the block that are being adapting to. The adaptation of the present invention coupled with the transmitted noise floor provides the capability of generating colored comfort noise. The following figure shows the idea in the form of a flow chart, as illustrated in FIG. 4a.

Figure 4A:
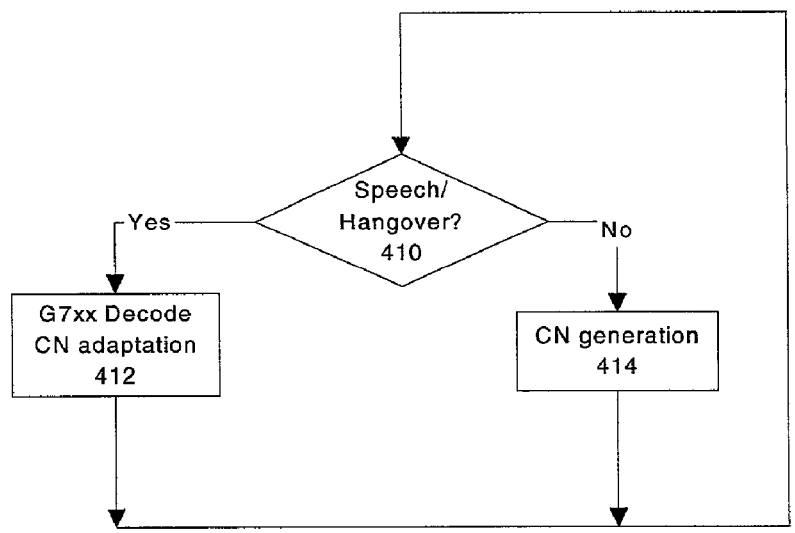
FIG. 4a is a flowchart illustrating an example of a decoder, according to an embodiment of a third aspect of the present invention.

FIG. 4a is an example of a flowchart for a decoder process, according to an embodiment of the present invention. At step 410, speech/hangover content may be identified. If speech/hangover content exists, comfort noise adaptation may be performed, at step 412. If speech/hangover content does not exist, comfort noise may be generated, at step 414. Information from step 412 and step 414 may be forwarded to the input of step 410.

Figure 4B:
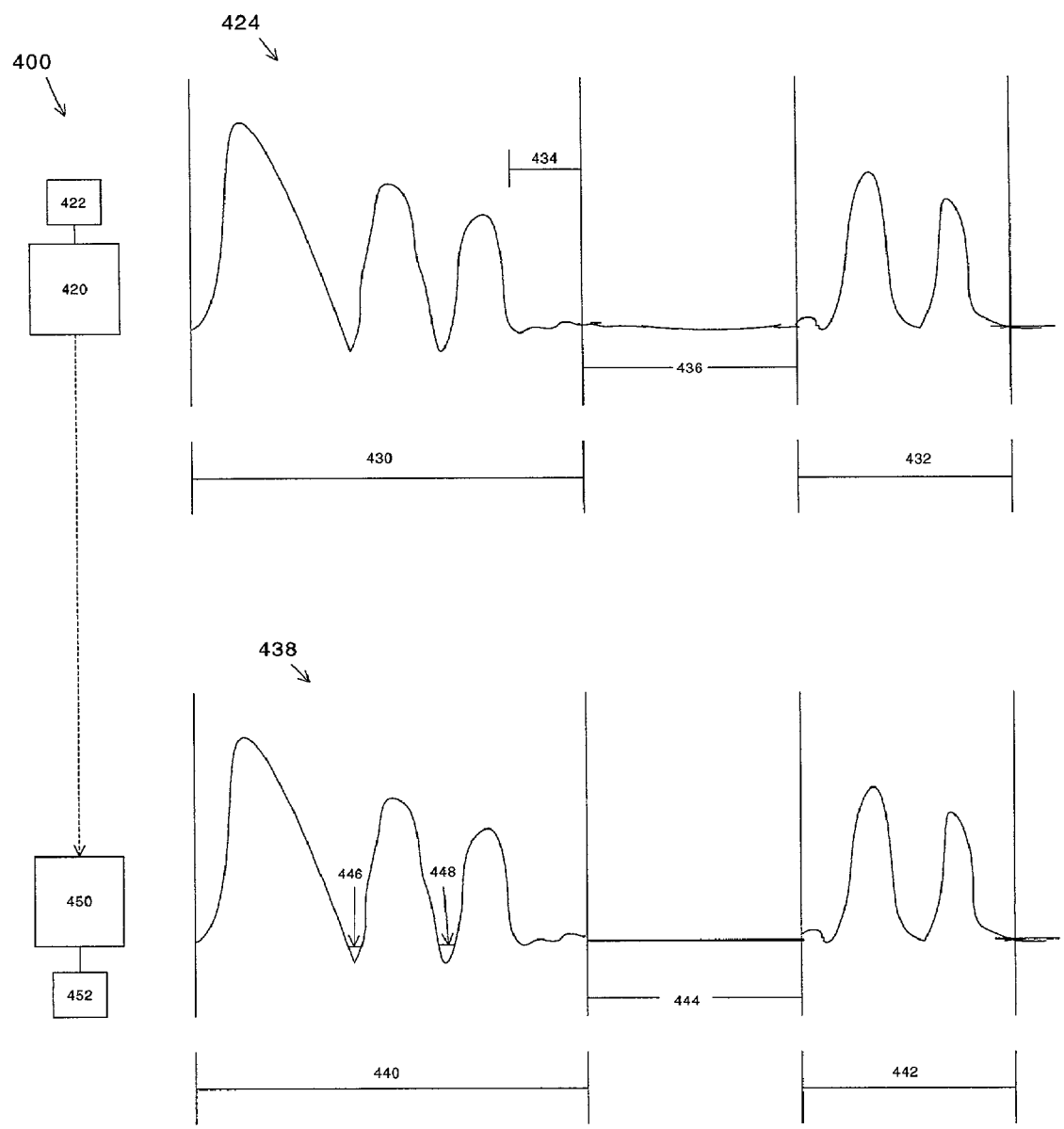
FIG. 4b is an example of a system for implementing decoder process, according to an embodiment of a third aspect of the present invention.

FIG. 4b illustrates one example of a system 400 for implementing a decoder process, according to an embodiment of the present invention. FIG. 4 further illustrates an exemplary detection input signal 424, which is processed for transmission, and a received signal 438 (both show signal amplitude as x-reference over time as y-reference). 422 may represent a phone or other voice communication device attached to an encoder 420 which processes and transmits voice and other signals to decoder 450. Signals are received by a receiving phone or other voice communication device 452. In this example, voice signal 430 and voice signal 432 are detected by a voice activity detector associated with devices 422 and/or 420 and transmitted to a receiving end (450 and/or 452), as signal 440 and signal 442, respectively. 434 may represent a hangover portion of voice signal which may indicate a transition from voice to silence. A noise floor estimator may be implemented to detect background noise. Signal 436 represents background noise. In one example, a measurement of power associated with background noise 436 may be transmitted. For example, background noise 436 may have a power of −60 dB. Signal 444 may represent background noise generated at a power of −60 dB.

According to the present invention, on the decoder side, small pauses (e.g., 446 and 448) during voice signal 440 may be used to generate background noise 444 via an adaptive algorithm. In other words, background noise may be learned from small pauses or gaps during a voice signal, such as 440. This information may be used to generate a filter 462 of FIG. 4c. As a result, information that is sent from encoder 420 to decoder 450 may be conserved by limiting transmission to voice signals. The present invention provides a method and system for adapting on a decode side when background noise itself is not transmitted. In other words, transmission may be limited to voice signals. As a result, bandwidth may be conserved by not sending information related to background noise. According to another example, hangover 434 may be used to generate background noise. Hangover 434 may represent a transition period between voice and non-voice portions. Thus, hangover 434 may contain information regarding background noise which may be used to generate background noise at 444.

Figure 4C:
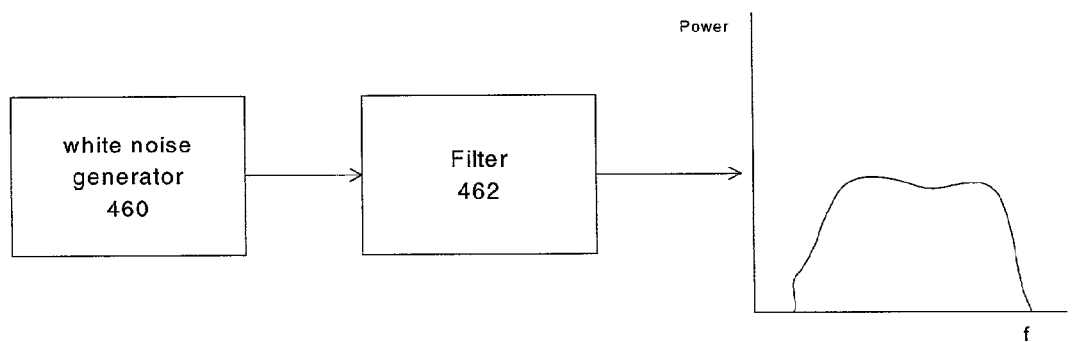
FIG. 4c is an example of a system for generator background noise, according to an embodiment of a third aspect of the present invention.

FIG. 4c is an example of a system for generating background noise, according to an embodiment of the present invention. White noise generator 460 generates white noise for use in creating replacement background noise for insertion during non-voice portions at the receiving end and may include a random number generator, although other types of generators may be implemented. Filter 462 receives the output of the white noise generator 460 and may represent an excitation filter, which may be fixed in one example. Further, via an adaptive algorithm, filter 462 may be created based on information related to small pauses, e.g., 446 and 448, or hangover portions, e.g., 434, during a voice signal. This information may be used to accurately and efficiently generate background noise during non-voice signals. As a result, filter 462 may output a noise sequence that represents true (or approximately true) noise or characteristics of such noise detected at the encoder side between voice signals.

According to still another embodiment of the present invention, a method and system for determining filter gain and automatic gain control for fixed point low delay algorithms in real time systems may be provided. In systems where low latency may be imperative and where the filter is not a constant but variable based on input signal, a method and system for determining filter gain and automatic gain control (AGC) may be implemented. The present invention provides a method and system for implementing low MIPS where the method and system is further useful in applications generating a single sample (or few samples) per call. Other applications may be implemented in accordance with the present invention.

An additional aspect of the present invention may involve computing the gain of a filter using an approximation calculation. This may involve filtering a signal similar in spectrum to the input to be filtered and then fine-tuning the signal. The fine tuning process of this aspect of the present invention may be based on a short term moving mean square calculation in the low delay, low MIPS state of the algorithm. Other variations may be implemented.

In yet another arrangement, the present invention provides a method and system for controlling the output gain using lower MIPS compared to a brute force calculation of the gain and then scaling output based on that gain. The method and system of the present invention may be particularly applicable in single sample (or few samples) input scenarios.

According to an embodiment of the present invention, the approximate output gain of a filter may be calculated by filtering a known (or representative) input signal. This calculation may be accomplished in a non time-critical routine or at the beginning of the algorithm if the filter taps are constant, for example. Using the gain ($G_o$), the scale factor (SF) may be computed, for a given Root Mean Square (RMS) value of the output ($G_R$). The value of $G_R$ may be determined by other means or it can be a constant output level.

Figure 5:
FIG. 5 is a block diagram illustrating an example of a filter, according to an embodiment of a fourth aspect of the present invention.
Figure 6:
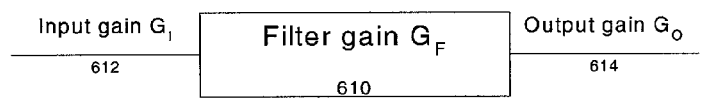
FIG. 6 is a block diagram illustrating an example of a filter, according to an embodiment of a fourth aspect of the present invention.

FIG. 5 and FIG. 6 illustrate examples of block diagrams of a filter and filter gain $G_F$, according to an embodiment of the present invention. FIG. 5 shows a representative input signal 512 being filtered by Filter 510 to result in an approximate output gain, as shown by 514. FIG. 6 shows an input gain $G_I$, as shown by 612, being filtered by a Filter Gain $G_F$, as shown by 610 with an output gain $G_O$, as shown by 614. The following calculations may apply to the filter of FIG. 6, according to an embodiment of the present invention.

$$G_O = G_F \times G_I$$

$$G_R = G_O \times SF$$

As for the fine-tuning of gain, the scale factor calculated during the non-critical phase of the algorithm may now be utilized to control the gain of the output, during the real time filtering, for example. As the output may be available sample by sample, the mean square value of a block of such samples may be calculated over a predetermined period of time, which may be equal to the block length, for example. When a predetermined block length (L) is reached, the mean square value may be compared to the square of an output RMS. The output RMS value may be determined by other methods. To facilitate finding the mean, the inverse of L may be calculated, resulting in a simple multiple or L may be made a multiple of 2, or other number. Depending on whether the gain of the output is smaller than $G_R$−D dB or greater than $G_R$+D dB, the scale factor may be increased by a small predetermined amount delta (Δ) dB. Δ represents whether the change is fast or gradual and D represents a predetermined constant that may be user defined.

Figure 7:
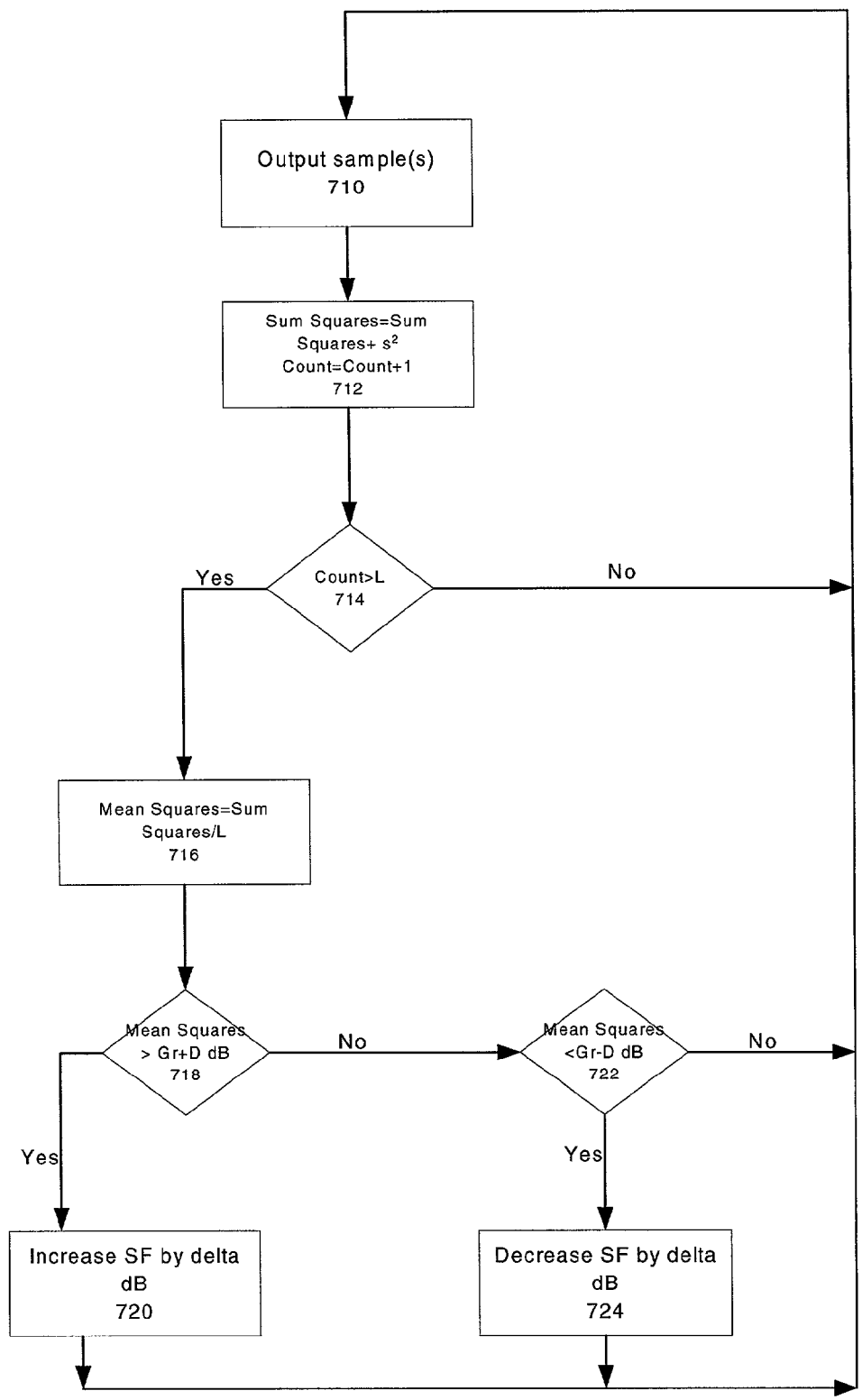
FIG. 7 is a flowchart illustrating an example of a process for fine tuning automatic gain control, according to an embodiment of a fourth aspect of the present invention.

FIG. 7 illustrates a process for fine tuning AGC, according to an embodiment of the present invention. At step 710, a sample, as represented by s, may be outputted. At step 712, a sum squares calculation may be performed where sum squares may be equal to sum squares +$s^2$, where s represents the sample and sum squares represents the sum of the squares of each sample. In addition, a counter may be advanced by one or other predetermined value. At step 714, if the count is determined to be greater than a predetermined value of L (e.g., block length), a mean squares calculation may be performed wherein mean squares may be equal to the value of sum squares divided by L, as shown by step 716. Otherwise, one or more samples may be outputted, at step 710. At step 718, the value of mean squares may be determined to be greater than $G_R$+D dB. The constant D represents a predetermined constant that may be user defined. If so, the value of SF may be creased by delta dB, at step 720. If the value of mean squares is determined to be less than $G_R$–D dB, at step 722, SF may be decreased by delta dB, at step 724. Otherwise, one or more output samples may be received at step 710. At an output of step 720 and/or step 724, a feedback loop may be established back to step 710.

After the approximate gain is applied to the output, to ensure that the noise generated is within ±2 dB, automatic gain control (AGC) may be applied. The output gain may be calculated as a block average over 4 ms. If this average is greater (or less) than 6 dB of a required noise floor, the output gain may be reduced (or increased) by 3 dB every 4 ms.

According to another embodiment of the present invention, CNG module compresses and reconstructs the silence part of speech signals. CNG works with any voice activity detector, e.g., Voice Activity Detection with Automatic Gain Control (VAGC) module, or with an echo canceller, e.g., Echo Canceller with Single Reflector (ECSR) module, to compress silence or generate comfort noise. Other applications may be implemented. CNG can be used in a variety of ways outlined below and in FIGS. 8–14.

Figure 8:
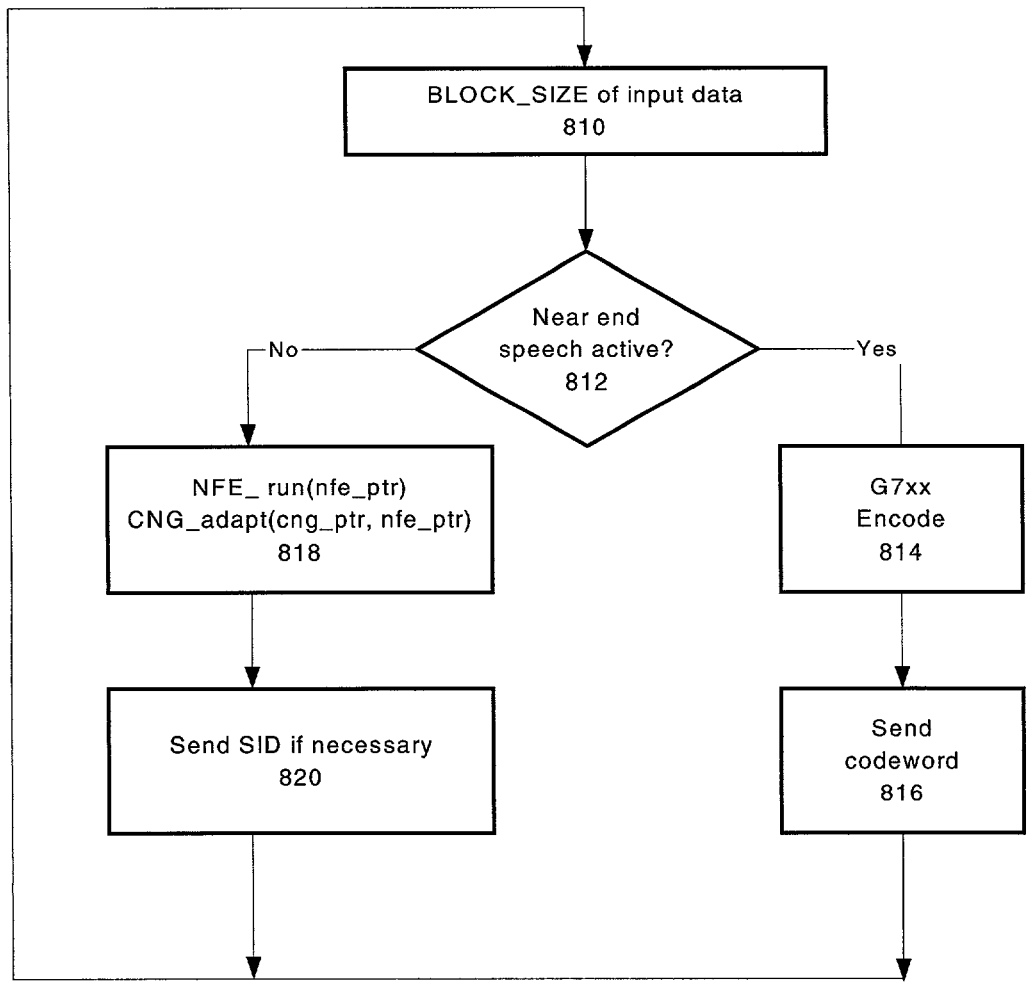
FIG. 8 illustrates an example of a system using CNG on an encode side, according to an embodiment of the present invention.

FIG. 8 illustrates an example of a system using CNG on an encode side, according to an embodiment of the present invention. This mode of operation may be used when a vocoder does not have a silence compression capability. To improve the compression of the system, CNG adapts to the noise between the speech data and creates silence insertion descriptors (SID), when the speech is inactive, as shown in FIG. 8.

As shown in FIG. 8, an encoder may receive a BLOCK_SIZE of input data, at step 810. At step 812, near end speech activity may be determined. If near end speech is inactive, NFE_run and CNG_adapt functions may be executed, at step 818. SID packets may be sent, if necessary, at step 820. If near end speech is active, G7xx encoding is performed, at step 814, and codeword is sent, at step 816, to the channel (transmitted to the decoder), which may be used to decode the signal information at the decoder. After the output of step 820 and/or step 816, the state of the system may be reset to receive new input data at step 810. From this point onwards, the system restarts and converts the input data into a speech codeword of step 816 or SID packets of step 820 where the process continues until the speech input stops (e.g., the call has ended).

Figure 9:
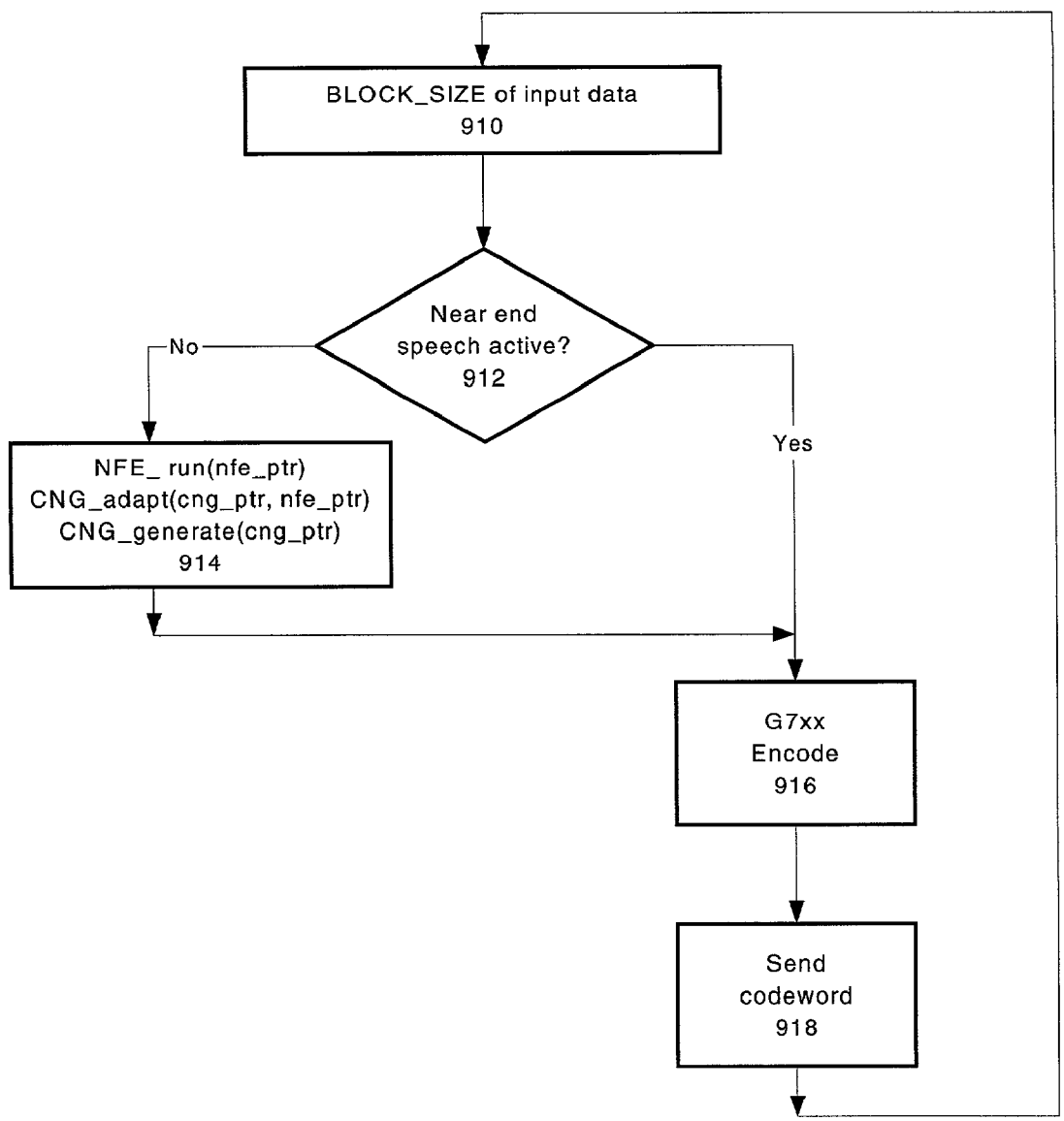
FIG. 9 illustrates an example of a system using CNG on an encode side when SRD is not sent, according to an embodiment of the present invention.

FIG. 9 illustrates an example of a system using CNG on an encode side when SID is not sent, according to an embodiment of the present invention. At step 910, BLOCK_SIZE of input data may be received. When near end speech is determined to be inactive, at step 912, CNG adapts and generates noise, at step 914, which is encoded by the vocoder. In particular, at step 914, NFE_run, CNG_adapt and CNG_generate functions may be executed. This mode may be used when the residual echo and the noise combination is perceptually unpleasant. CNG generates perceptually enhanced noise based on the average spectrum of the input, as shown in FIG. 9. If near end speech is determined to be active, at step 912, G7xx encoding occurs, at step 916 and the encoded codeword is sent at step 918 to the channel (transmitted to the decoder) to synthesize speech at the decoder. After an output of step 918, the system may be reset to step 910. The system is ready to receive new BLOCK_SIZE number of data samples and the process continues until the speech input stops (e.g., the call has ended).

Figure 10:
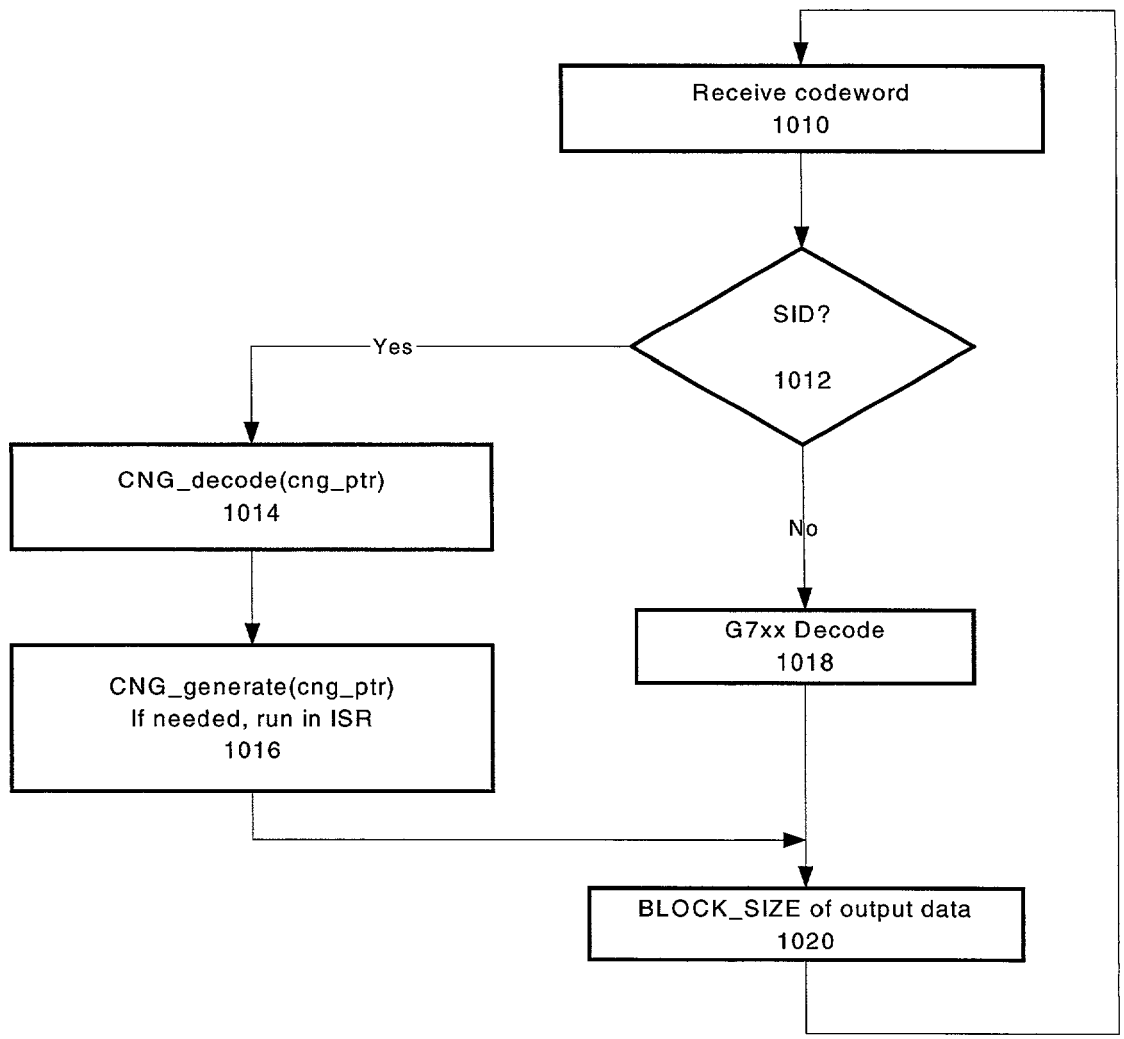
FIG. 10 illustrates an example of a system using CNG on a decode side, according to an embodiment of the present invention.

FIG. 10 illustrates an example of a system using CNG on a decode side, according to an embodiment of the present invention. If the received codeword, at step 1010, is a SID as determined by step 1012, CNG decodes this information, at step 1014 and generates comfort noise at step 1016. In particular, CNG_decode function may be executed at step 1014 and $CNG_{13}$ generate function may be executed at step 1016. The SID typically includes spectral information (e.g., reflection coefficients) of noise to be generated. This mode of operation may be used when CNG or any other comfort noise generation algorithm conforming to the IETF (or other) standard is used on the encode side. CNG_generate( ) may also be used in the Interrupt Service Routine (ISR), if so desired. If SID is not received at 1012, G7xx decoding is performed at step 1018. At step 1020, BLOCK_SIZE of output data may be generated and forwarded to step 1010. After speech/silence is output at step 1020, the system is then reset to receive a new codeword or SID and the process continues until the call ends (e.g., the codeword or SID stops).

Figure 11:
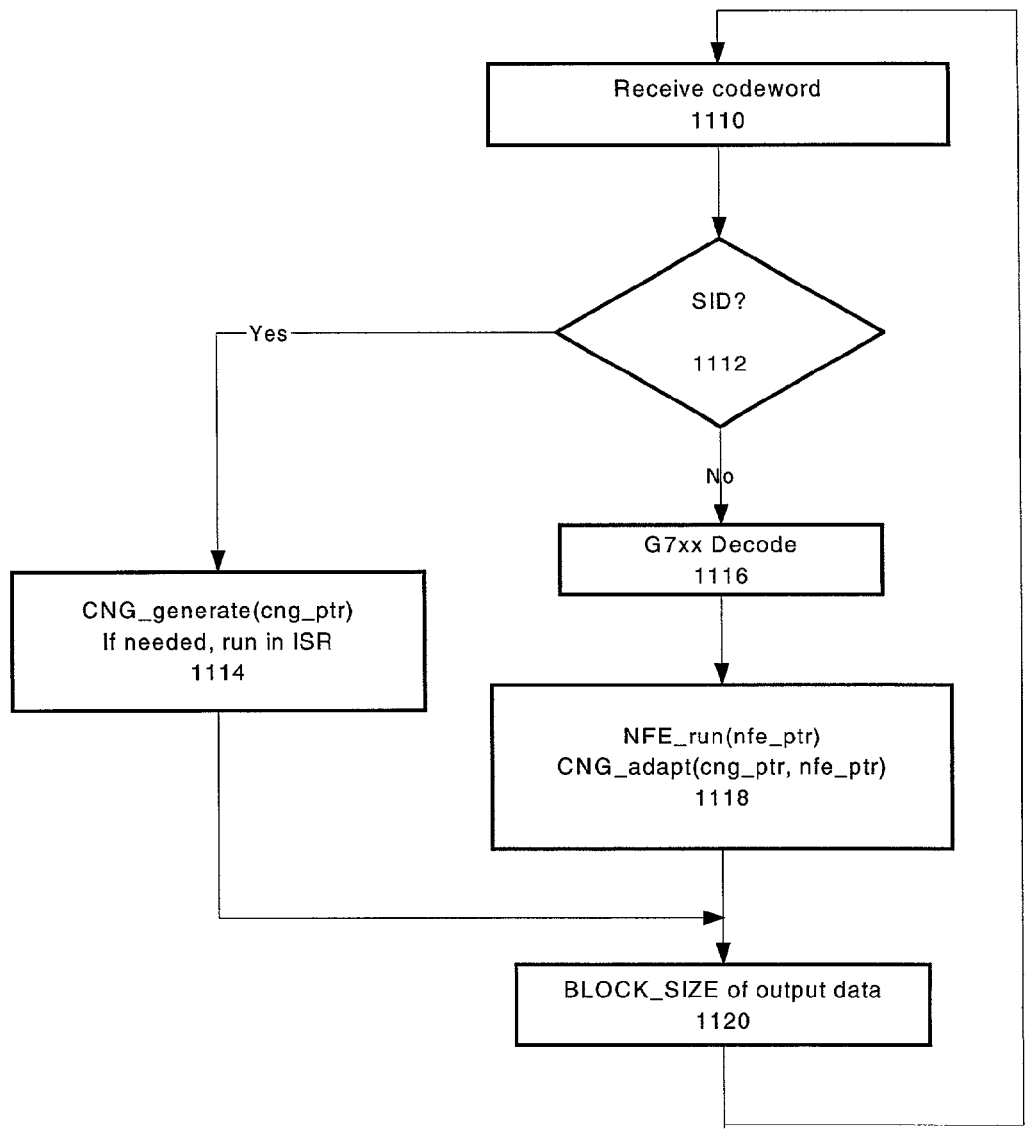
FIG. 11 illustrates an example of a system using CNG on a decode side, according to an embodiment of the present invention.

FIG. 11 illustrates another example of a system using CNG on the decode side, according to an embodiment of the present invention. In this case the SID has no information about the noise, except, the noise floor. CNG adapts to the noise between the speech data, during the vocoder decoding process, and generates noise when a SID is received. This scenario enables the user to generate noise closer to the actual background noise, rather than simple white noise.

At step 1110, codeword data is received. SID may be detected at step 1112. If SID is not received and therefore not detected, G7xx decoding is performed at step 1116. Functions NFE_run and CNG_adapt are performed at step 1118. In addition, FIG. 11 shows a system where CNG_adapt( ) adapts to the decoded speech, at step 1118. CNG_generate( ) may also be used, at step 1114, in the ISR if so desired. At step 1120, BLOCK_SIZE of output data may be generated and forwarded to step 1110.

Additional details regarding exemplary constants, structures, prototypes, memory usage, and file descriptions, in accordance with one particular embodiment of the present invention, will now follow.

```
/* The following constants define the default parameter values */
#define CNG_ADAPTSIZE_DEF (40)
#define CNG_GENSIZE_DEF (40)
/* The following constants define the max. and min. parameter values */
#define CNG_MAX_ADAPTSIZE (80)
#define CNG_MAX_GENSIZE (80)
#define CNG_MIN_ADAPTSIZE (40)
#define CNG_MIN_GENSIZE (1)
/* The following constant defines the size of the SID */
#define CNG_SIDSIZE (11)
/* The following constants define the modes of CNG operation */
#define CNG_NO_SID (0)
#define CNG_REFLC_SID (1)
Internal Object Definition
typedef struct {
    int stackMemAddr;      /* Saving stackMem address */
    int xm1;               /* Band Pass filter history */
    int xm2;               /* Band Pass filter history */
    int xm3;               /* Band Pass filter history */
    int ym1;               /* Band Pass filter history */
    int ym2;               /* Band Pass filter history */
    int ym3;               /* Band Pass filter history */
    int lmsErr;            /* Error for lms */
    int highBuf;           /* Buffer for AGC calc. */
    int lowBuf;            /* Buffer for AGC calc. */
    int highPrevBuf;       /* Buffer for AGC calc. */
    int lowPrevBuf;        /* Buffer for AGC calc. */
```

-continued

```
    int count;              /* Count for AGC */
    int seed1;              /* Seed for Rand Generator 1 */
    int c13849;             /* Constant for Rand */
    int seed2;              /* Seed for Rand Generator 2 */
    int c31821;             /* Constant for Rand */
    int lmsPredCoef[11];    /* Predictor coeffs. */
    int curRms;             /* Gain factor for output */
    int c15330;             /* AGC constant */
    int c21835;             /* AGC constant */
    int c14736;             /* AGC constant */
    int flag;               /* AGC flag */
    int noise;              /* Noise floor */
    int randCount;          /* Counter for randomizing */
    int genSize1;           /* pGENSIZE-1 */
    int adaptSize1;         /* pADAPTSIZE-1 */
    int lmsHist[11];        /* History for lms */
    int genMem[10];         /* History for synth filter */
} _CNG_Internal;
Local Parameter Definition
typedef struct {
    int  pADAPTSIZE;        /* Adapt block size */
    int  pGENSIZE;          /* Generate block size */
} CNG_Params;
Object Definition
typedef struct {
    long    buffer;         /* Even alignment */
    _CNG_Internal internal; /* internal object */
    int     *dst_ptr;
    int     *src_ptr;
    int     *sid_ptr;
    int     sidMode;
} CNG_Obj;
typedef CNG_Obj *CNG_Handle;
Function Prototypes may include the following:
void CNG_init(
    CNG_Handle cng_ptr,
    CNG_Params *params_ptr,
    int   *stack_ptr);
void CNG_adapt(
    CNG_Handle cng_ptr,
    NFE_Handle nfe_ptr);
void CNG_decode(
    CNG_Handle cng_ptr);
void CNG_generate(
    CNG_Handle cng_ptr);
```

The following is a list and description of exemplary files associated with the CNG module.

TABLE 1

| Directory | File | Description |
| --- | --- | --- |
| INCLUDE | CNG.H | C header file for CNG |
| LIB | CNG.054 | Object file containing CNG_init( ), CNG_adapt( ), CNG_detect( ) and CNG_decode( ), near mode |
| LIB | CNG.F54 | Object file containing CNG_init( ), CNG_adapt( ), CNG_detect( ) and CNG_decode( ), far mode |
| EXAMPLES | CNG_EX.C | C usage example file for CNG |
| EXAMPLES | CNG_EX.CMD | C54x linker command file for CNG_EX.C |
| EXAMPLES | B_CNG.BAT | DOS batch file for building CNG_EX.C |
| EXAMPLES | CNG_EX.054 | C54x object file for CNG_EX.C, after running B_CNG.BAT |
| EXAMPLES | CNG_EX.X54 | C54x DSP executable file for CNG_EX.C, after running B_CNG.BAT |
| EXAMPLES | CNG_EX.MAP | C54x map file for CNG_EX.C, after running B_CNG.BAT |
| DOC | CNG_MAN.PDF | Manpage file for CNG |

The following example code shows how the CNG module adapts and generates the silence part of speech signals. G726 in Linear mode is used to encode and decode the active voice. The VAGC module is used to detect silence. The Silence Insertion Descriptor (SID) may be assumed to have the Internet Engineering Task Force (IETF) draft SID format.

```
#include <comm.h>
#include <nfe.h>
#include <vagc.h>
#include <cng.h>
#include <g726.h>
#undef USE_C_STACK /* If defined, CNG will use the C stack. */
#define BLOCK_SIZE (40)
#define SPEECH (0)
#define SID (1)
NFE_Obj nfeObj;
VAGC_Obj vagcObj;
CNG_Obj cngObj;
G726_Obj encObj;
G726_Obj decObj;
GLOBAL_Params globals = {
    4004,       /* 0 dBm level for input signal */
    4004};      /* 0 dBm level for output signal */
NFE_Params nfePara = {
    NFE_MINNOISE_DEF,    /* Minimum noise floor in dBm */
    NFE_MAXNOISE_DEF,    /* Maximum noise floor in dBm */
    BLOCK_SIZE};
VAGC_Params vagcPara = {
    VAGC_tSUSTAIN_DEF, /* Number of blocks for Sustain */
    VAGC_tHCNGOVER_DEF, /* Number of blocks for HCNGover */
    VAGC_tDECAY_DEF, /* Decay time */
    VAGC_pMAXGAIN_DEF, /* Maximum gain */
    VAGC_pINITGAIN_DEF, /* Initial gain */
    VAGC_pGLI_DEF}; /* Input speech gain*/
CNG_Params cngPara = {
    BLOCK_SIZE,   /* Adapt block size */
    BLOCK_SIZE};  /* Generate block size */
#ifndef USE_C_STACK
extern int *vpoStack_ptr; /* VP Open stack to be used by CNG */
#endif
int src[BLOCK_SIZE];
int dst[BLOCK_SIZE];
int mubuf[BLOCK_SIZE/2];
int cBuf[BLOCK_SIZE/2];
int sid[CNG_SIDSIZE];
/*
 * ======== main ========
 */
void main( )
{
    NFE_Handle nfe_ptr = &nfeObj;
    VAGC_Handle vagc_ptr = &vagcObj;
    CNG_Handle cng_ptr = &cngObj;
    G726_Handle enc_ptr = &encObj;
    G726_Handle dec_ptr = &decObj;
    int buffer[BLOCK_SIZE];
    int retVal;
    int codeword;
    int *stack_ptr;
    /*
     * Placeholder: Initialize host device driver
     */
#ifdef USE_C_STACK
    stack_ptr = NULL;
#else
    stack_ptr = vpoStack_ptr;
#endif
    /*
     * Initialize VP OPEN modules
     */
    nfe_ptr->src_ptr = src;
    nfe_ptr->xmit_ptr = NULL;
    NFE_init(nfe_ptr, &globals, &nfePara, NFE_COLDSTART,
        stack_ptr);
    vagc_ptr->dst_ptr = NULL;
    vagc_ptr->agcMode = VAGC_BYPASSAGC;
    VAGC_init(vagc_ptr, &globals, &vagcPara, VAGC_COLDSTART,
        stack_ptr);
    /* Initialize G726 encoder/decoder: 5 ms block, 32 kbps rate */
    G726_init(enc_ptr, G726_ENCODE, stack_ptr, BLOCK_SIZE,
```

```
4, 0);
G726_init(dec_ptr, G726_DECODE, stack_ptr, BLOCK_SIZE,
4, 0);
cng_ptr->src_ptr = src;
cng_ptr->dst_ptr = dst;
cng_ptr->sid_ptr = sid;
cng_ptr->sidMode = CNG_REFLC_SID;
CNG_init(cng_ptr, &cngPara, stack_ptr);
while(1) {
    /*
     * Placeholder: Read BLOCK_SIZE/2 words of mu-law input speech
     *              data into mubuff[ ]
     */
    mu2linear(BLOCK_SIZE, mubuf, src);
    NFE_run(nfe_ptr);
    VAGC_run(vagc_ptr, nfe_ptr);
    /* Encoder */
    if (vagc_ptr->portActive) {
        enc_ptr->src_ptr = src;
        enc_ptr->dst_ptr = cBuf;
        G726_encode(enc_ptr);
        codeword = SPEECH;
    }
    else {
        CNG_adapt(cng_ptr, nfe_ptr);
        codeword = SID;
    }
    /* Decoder */
    if(codeword == SPEECH) {
        dec_ptr->src_ptr = cBuf;
        dec_ptr->dst_ptr = dst;
        G726_decode(dec_ptr);
    }
    else {
        /*
         * Placeholder: copy received information to sid buffer.
         *              Set unused reflection coefficients to zero.
         */
        CNG_decode(cng_ptr);
        CNG_generate(cng_ptr);
    }
    /*
     * Placeholder: write BLOCK_SIZE samples of decoded speech from
     *              dst[ ] to output file
     */
}
/* Placeholder: close the host device driver */
}
```

The following example code shows how the CNG module compresses and reconstructs the silence part of speech signals in an echo cancellation application. G726 is used to encode and decode the active voice. In this example, CNG is working with ECSR. The SID may be assumed to have only the noise level information.

```
#include <comm.h>
#include <nfe.h>
#include <ecsr.h>
#include <cng.h>
#include <g726.h>
#undef USE_C_STACK /* If defined, CNG will use the C stack. */
#define BLOCK_SIZE (40)
#define TAIL_LENGTH (256) /* 32 ms Tail Length */
#define SPEECH (0)
#define SID (1)
NFE_Obj nfeObj1;
NFE_Obj nfeObj2;
ECSR_Obj ecObj;
CNG_Obj cngObj;
G726_Obj encObj;
G726_Obj decObj;
GLOBAL_Params globals = {
    4004,       /* 0 dBm level for input signal */
    4004};      /* 0 dBm level for output signal */
NFE_Params nfePara = {
    NFE_MINNOISE_DEF,       /* Minimum noise floor in dBm */
    NFE_MAXNOISE_DEF,       /* Maximum noise floor in dBm */
    BLOCK_SIZE};
ECSR_Params ecsrPara = {
    BLOCK_SIZE,             /* Block size for ECSR_run( ) */
    TAIL_LENGTH,            /* Tail length in samples */
    0,                      /* ISR block size for ECSR_run( ) */
    0,                      /* minimum voice power */
    100};                   /* hangover time */
CNG_Params cngPara = {
    BLOCK_SIZE,             /* Adapt block size */
    BLOCK_SIZE};            /* Adapt block size */
#ifndef USE_C_STACK
extern int VPO_STACKMEM;
int *vpoStack_ptr = &VPO_STACKMEM;   /* VP Open stack used
                                        by modules */
#endif
int src[BLOCK_SIZE];
int dst[BLOCK_SIZE];
int muBuf[BLOCK_SIZE/2];
int cbuf[BLOCK_SIZE/2];
int rin[BLOCK_SIZE];
int sin[BLOCK_SIZE];
int sout[BLOCK_SIZE];
int nlpOut[BLOCK_SIZE];
int dlyBuf[ECSR_32MS_DLY_BUF_SIZE];
/*
 * ======== main ========
 */
void main( )
{
    NFE_Handle nfe1_ptr = &nfeObj1;
    NFE_Handle nfe2_ptr = &nfeObj2;
    ECSR_Handle ec_ptr = &ecObj;
    CNG_Handle cng_ptr = &cngObj;
    G726_Handle enc_ptr = &encObj;
    G726_Handle dec_ptr = &decObj;
    int  buffer[BLOCK_SIZE];
    int  retVal;
    int *stack_ptr;
    /*
     * Placeholder: Initialize host device driver
     */
#ifdef USE_C_STACK
    stack_ptr = NULL;
#else
    stack_ptr = vpoStack_ptr;
#endif
    /*
     * Initialize VP OPEN modules
     */
    ec_ptr->control = ECSR_ERL | ECSR_NLP;
    ec_ptr->rin_ptr = rin;
    ec_ptr->sin_ptr = sin;
    ec_ptr->soutFull_ptr = sout;
    ec_ptr->nlpOut_ptr = nlpOut;
    ec_ptr->dlyBuf_ptr =dlyBuf;
    ECSR_init(ec_ptr, &globals, &ecsrPara, ECSR_COLDSTART,
    stack_ptr);
    /*
     * nfe1 is used for noise estimation on the encoding side
     */
    nfe1_ptr->src_ptr = sout;
    nfe1_ptr->xmit_ptr = rin;
    NFE_init(nfe1_ptr, &globals, &nfePara, NFE_COLDSTART,
    stack_ptr);
    /*
     * nfe2 is used for noise estimation on the decoding side
     */
    nfe2_ptr->src_ptr = dst;
    nfe2_ptr->xmit_ptr = NULL;
    NFE_init(nfe2_ptr, &globals, &nfePara, NFE_COLDSTART,
    stack_ptr);
    /* Initialize G726 encoder/decoder: 5 ms block, 32 kbps rate */
    enc_ptr->src_ptr = src;
    enc_ptr->dst_ptr = cbuf;
    G726_init(enc_ptr, G726_ENCODE, stack_ptr, BLOCK_SIZE,
```

-continued

```
4, 0);
dec_ptr->src_ptr = cbuf;
dec_ptr->dst_ptr = dst;
G726_init(dec_ptr, G726_DECODE, stack_ptr, BLOCK_SIZE,
4, 0);
/*
 * As dst buffer is mutually exclusive, we can use the same buffer
 */
cng_ptr->src_ptr = dst;
cng_ptr->dst_ptr = dst;
/* SID is not required, set sidMode to CNG_NO_SID:Lower MIPS */
cng_ptr->sidMode = CNG_NO_SID;
CNG_init(cng_ptr, &cngPara, stack_ptr);
while (1) {
    /*
     * Placeholder: read BLOCK_SIZE/2 samples of input far-end
     *     data from a mu-law file into muBuf[ ]
     */
    mu2linear(BLOCK_SIZE, muBuf, rin);
    /*
     * Placeholder: read BLOCK_SIZE/2 samples of input near-end
     *     data from a mu-law file into muBuf[ ]
     */
    mu2linear(BLOCK_SIZE, muBuf, sin);
    ECSR_run(ec_ptr, nfe1_ptr);
    NFE_run(nfe1_ptr);
    /* Encoding */
    if (!(ec_ptr->status & ECSR_NLP_BLK_ACT)) {
        G726_encode(enc_ptr);
        codeword = SPEECH;
    }
    else {
        codeword = SID;
        /*
         * As the SID is just the noise floor, transmit NFE
         * noisefloor. CNG_adapt is not necessary
         */
    }
    /* Decoding */
    if(codeword == SPEECH) {
        G726_decode(dec_ptr);
        NFE_run(nfe2_ptr);
        CNG_adapt(cng_ptr,nfe2_ptr);
    }
    else {
        CNG_generate(cng_ptr);
    }
    /*
     * Placeholder: write BLOCK_SIZE samples of decoded speech
     *     from dst[ ] to output file
     */
    /* Placeholder: break when done */
}
/* Placeholder: close the host device driver */
}
```

Module functions of the present invention may include CNG_init( ), CNG_adapt( ), CNG_decode( ), and CNG_generate( ), although other module functions may be implemented.

Exemplary code associated with the CNG_init( ) module function includes:

```
void CNG_init(
    CNG_Handle cng_ptr,        /* pointer to local CNG object */
    CNG_Params *cngParams_ptr, /* pointer to CNG parameters */
    int *stack_ptr);           /* pointer to stack memory */
```

Modules may have an initialization function that is called first. Prior to calling CNG's initialization function, CNG_init( ), two data structures are created. A first structure that is created may include the CNG object. One object may be implemented for each simultaneous use of CNG. CNG_init( ) initializes this object. A second structure may include CNG parameters. This structure is initialized to the individual requirements. Table 2 below shows exemplary parameters and their ranges.

CNG_init( ) may use three (or more) calling arguments. A first calling argument may include a pointer to the CNG object structure. A second calling argument may include a pointer to the CNG parameters structure. A third calling argument may include a pointer to stack scratch space, *stack_ptr. It points to the bottom (e.g., highest address) of the memory allocated for scratch space (e.g., temporary variables).

If *stack_ptr points to NULL, the existing C stack is used for scratch space. If a separate scratch space is used, there must be sufficient memory allocated for the module with the largest scratch space usage, plus overhead for any ISR usage that may be required if the module can be interrupted. The constant CNG_STACKMEMSIZE indicates the amount of scratch space required by CNG, not including any overhead for ISR usage.

TABLE 2

| Local Parameter/ Units | Defaults | Range | Definition |
|---|---|---|---|
| pADAPTSIZE/ samples | 40 | 40, 44, 48, 52, 56, 60, 64, 68, 72, 76, 80 (5 to 10 ms in 0.5 ms step size) | Block size in samples. CNG_adapt( ) is never used in the ISR. |
| pGENSIZE/ samples | 40 | 40, 44, 48, 52, 56, 60, 64, 68, 72, 76, 80 (5 to 10 ms in 0.5 ms step size) or 1, 2, 4, 8 for ISR | Block size in samples. If CNG_generate( ) is to be used in the ISR then set the pGENSIZE to 1, 2, 4 or 8. |

Function CNG_adapt( ):

```
void CNG_adapt(
    CNG_Handle cng_ptr,   /* pointer to local CNG object */
    NFE_Handle nfe_ptr);  /* pointer to NFE object */
```

Figure 12:
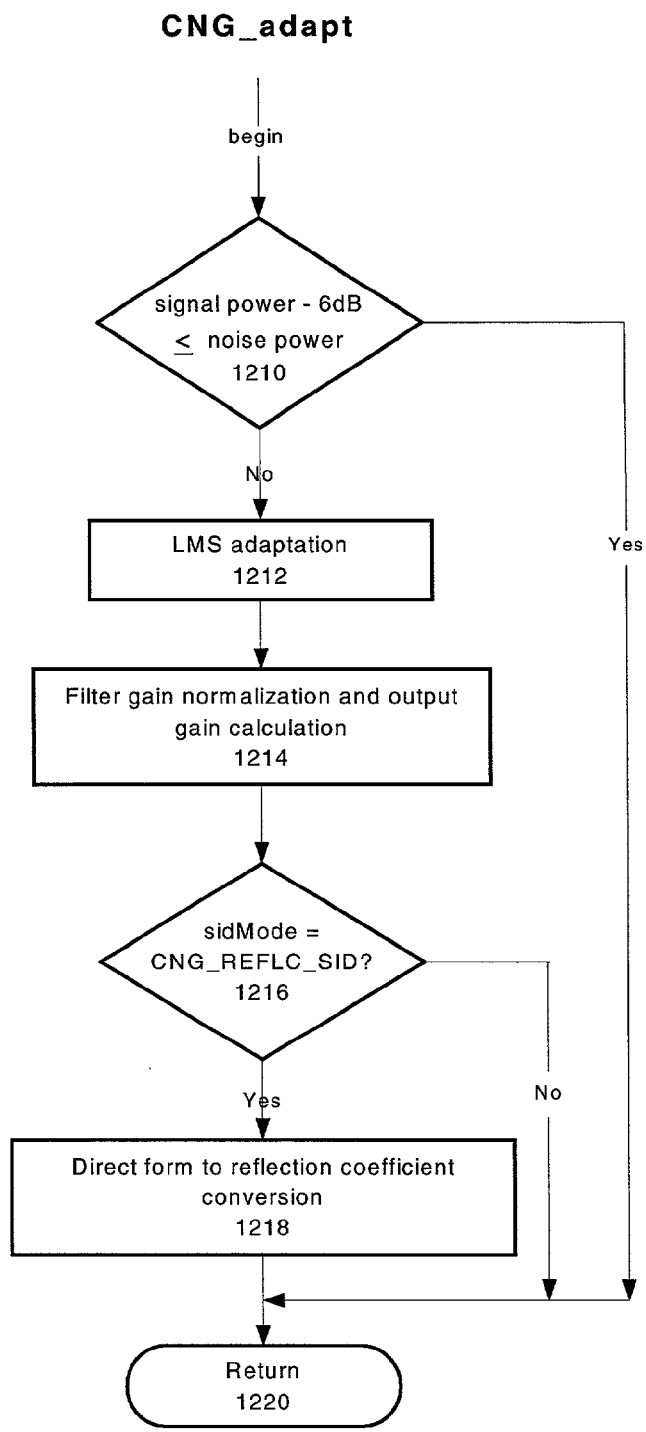
FIG. 12 illustrates a flowchart for a CNG_adapt function, according to an embodiment of the present invention.

FIG. 12 illustrates a flowchart for a CNG_adapt function, according to an embodiment of the present invention. Two calling arguments may include pointers that point to the CNG object and NFE object, respectively. Table 3 illustrates exemplary pointers and mode assignment for use in the CNG_adapt function of FIG. 12. Before calling CNG_adapt( ), the source pointer, the SID mode and SID buffer pointer are to be assigned. The source pointer is a pointer to the source buffer of size pADAPTSIZE on which adaptation is done. This is assigned to cng_ptr→src_ptr.

The SID mode value determines if CNG_adapt calculates the SID coefficients. The SID mode is specified through cng_ptr→sidMode. For applications not requiring SID calculations this mode may be set to CNG_NO_SID, else this value is set to CNG_REFLC_SID. If the CNG_REFLC_SID mode is used, then the user needs to assign the SID buffer pointer, cng_ptr→sid_ptr. The SID buffer should be of size CNG_SIDSIZE.

After the CNG object has been initialized, adaptation to silence (if found) may be performed by calling CNG_adapt( ) once every pADAPTSIZE samples. CNG_adapt( ) is called whenever speech inactivity is detected.

CNG_adapt( ) may not be called in an ISR. If the SID mode is set to CNG_REFLC_SID, CNG_adapt( ) may output the noisefloor and reflection coefficients in the SID buffer.

If the comfort noise payload contains only the noise floor and no other information regarding the noise spectrum, CNG_adapt( ) may be called to adapt to the noise between speech signals, to ensure that the noise generated is of a better quality and is closer to and more representative of the actual noise. To prevent adaptation to generated noise, CNG_adapt( ) may be called when the pADAPTSIZE number of samples contain the decoded speech and no CNG generated noise, as shown in FIG. 11.

FIG. 12 shows steps for executing a CNG_adapt function, according to an embodiment of the present invention. At step 1210, it may be determined whether signal power—6 dB is less than or equal to noise power. If not, LMS adaptation may be performed at step 1212. At step 1214, filter gain normalization and output gain calculation may be performed. At step 1216, it may be determined whether sid-Mode is equal to CNG_REFLC_SED. If so, direct form to reflection coefficient conversion may be performed, at step 1218. Return 1220 indicates the end of the CNG_adapt function.

TABLE 3

| Assignments (condition/function(s)) | Definition |
| --- | --- |
| src_ptr (required/CNG_adapt( )) | Points to source buffer of size pADAPTSIZE, on which adaptation is done. |
| sidMode (required/CNG_adapt( )) | Determines if CNG_adapt( ) has to calculate SID coefficients. |
| sid_ptr (optional/CNG_adapt( )) (required/CNG_decode( )) | Points to a buffer of CNG_SID_SIZE. Used by CNG_adapt( ) only if the sidMode is set to CNG_REFLC_SID. Always used by CNG_decode( ). |
| dst_ptr (required/CNG_generate( )) | Always used by CNG_generate( ). Points to a buffer of size pGENSIZE |

Exemplary code associated with the CNG_decode( ) module function is:

```
void CNG_decode( CNG_Handle cng_ptr); /*
    pointer to local CNG object */
```

Figure 13:
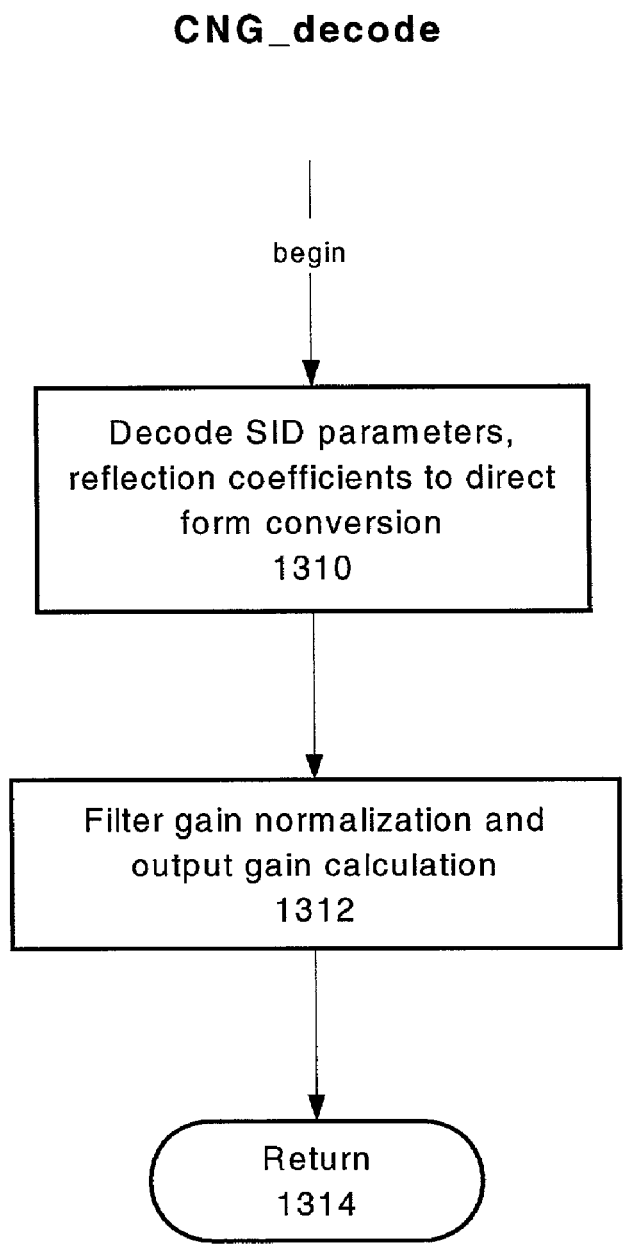
FIG. 13 illustrates a flowchart for a CNG_generate function, according to an embodiment of the present invention.

FIG. 13 illustrates a flowchart for a CNG_decode function, according to an embodiment of the present invention. As its only calling argument this function may take in a pointer to the CNG object. Table 3 illustrates pointers and mode assignment. Before calling CNG_decode( ), SID pointer cng_ptr→sid_ptr may be assigned to point to a buffer of size CNG_SIDSIZE. The unused reflection coefficients in the SID may be set to zero.

CNG_decode( ) may decode the silence insertion descriptor (SID) and initialize filter coefficients and object variables that are used by CNG_generate( ) for generation of the comfort noise. CNG_decode( ) may be called once every pADAPTSIZE number of samples. CNG_decode( ) may be used when the SID contains noise spectrum characteristics, namely, the reflection coefficients of the all pole filter.

In applications where the SID contains only the noise level, CNG_decode( ) may not be used. CNG_adapt( ) may used in the decoder as shown in FIG. 11. In the latter case, cng_ptr→sidMode may be set to CNG_NO_SID to reduce MIPS.

FIG. 13 shows steps for executing a CNG_decode function, according to an embodiment of the present invention. At step 1310, SID parameters may be decoded and reflection coefficients to direct form conversion may be performed. At step 1312, filter gain normalization and output gain calculation may be performed. Return 1314 indicates the end of CNG_decode function.

Exemplary code associated with the CNG_generate( ) module function is:

```
void CNG_generate( CNG_Handle cng_ptr); /*
    pointer to local CNG object */
```

Figure 14:
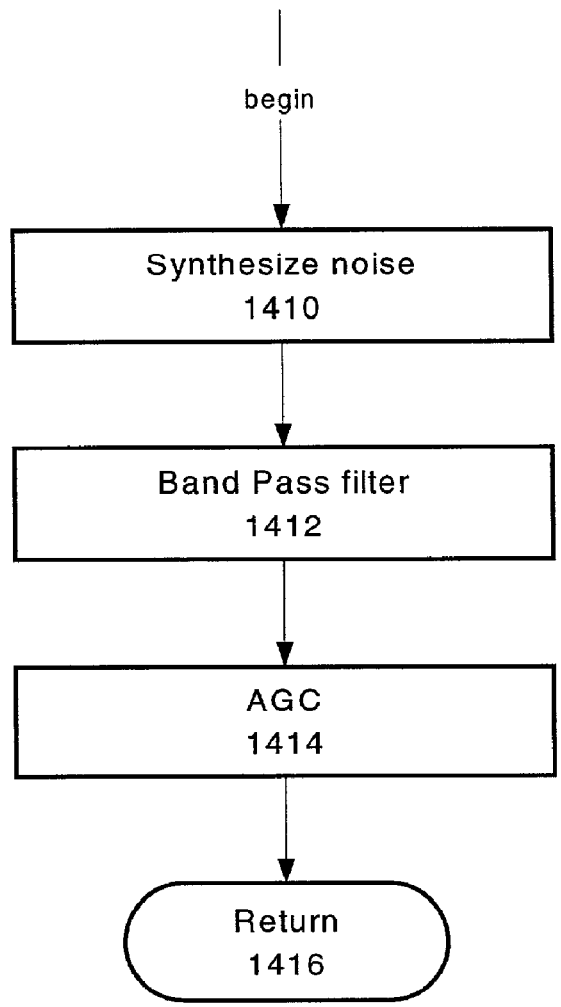
FIG. 14 illustrates a flowchart for a CNG_decode function, according to an embodiment of the present invention.

FIG. 14 illustrates a flowchart for a CNG_generate function, according to an embodiment of the present invention. A calling argument may include a pointer that points to the CNG object. Table 3 illustrates pointers and mode assignment. Prior to calling CNG_generate( ), cng_ptr→dst_ptr should be assigned to point to the output buffer of size pGENSIZE.

CNG_generate( ) may generate pGENSIZE number of samples each call. This function may also be called in the ISR. This distinction is to be specified through pGENSIZE (see CNG_init). The information for generating comfort noise may be taken directly from the object, which may be updated by either CNG_decode( ) or CNG_adapt( ).

FIG. 14 shows steps for an exemplary process for executing a CNG_generate function, according to an embodiment of the present invention. At step 1410, noise may be synthesized. At step 1412, band pass filter may be performed. At step 1414, automatic gain control is performed. Return 1416 indicates the end of CNG_generate function.

For module requirements of the present invention, functional specifications may include adapting to the silence part of speech, generating comfort noise, and creating silence insertion descriptors. As for adapting to the silence part of speech and generating comfort noise, the reconstructed comfort or background noise may preserve the energy and the spectrum shape of the original signal as much as possible. As for create silence insertion descriptors, SIDs may be created as described in the IETF draft on Real-Time Transport Protocol (RTP) payload for comfort noise, dated October 2001.

Performance specifications may include the quality of reconstructed silence (comfort noise) and may be, for example, in accordance with International Telecommunications Union (ITU) standard G.729/G.729A with Annex B.

In FIGS. 15–19, systems using the CNG in the absence of SID packets as discussed above are illustrated. The CNG software is used on the decode side. On the encode side, the silence is compressed as energy level and no spectral information is transmitted. CNG is not needed on the encode side. On the decode side, the CNG algorithm adapts to the speech generated by the G7xx decoder during speech segments and uses this information to synthesize silence/background noise in the absence of speech segments.

In its Magnesium™ product, Virata Corporation of Santa Clara, Calif., extends the benefits of integrated software on silicon (ISOS™)—pre-integrated software, pre-packaged systems, selectable software modules, system flexibility, all leading to rapid and low risk developments—to the voice processing market, providing a bundle of functions and interface drivers—vCore™—together with C54-compatible Digital Signal Processing (DSP) chips, such as those manufactured by Texas Instruments. Targeted for telecommunciations equipment, such as broadband Integrated Access Devices (IADs), Private Branch Exchange's (PBX's), key systems, wireless base stations, and IP Phones. This powerful combination of hardware and software is ideally suited to MIPS-intensive voice and telephony algorithms and may include VoDSL and VoIP applications.

Figure 16:
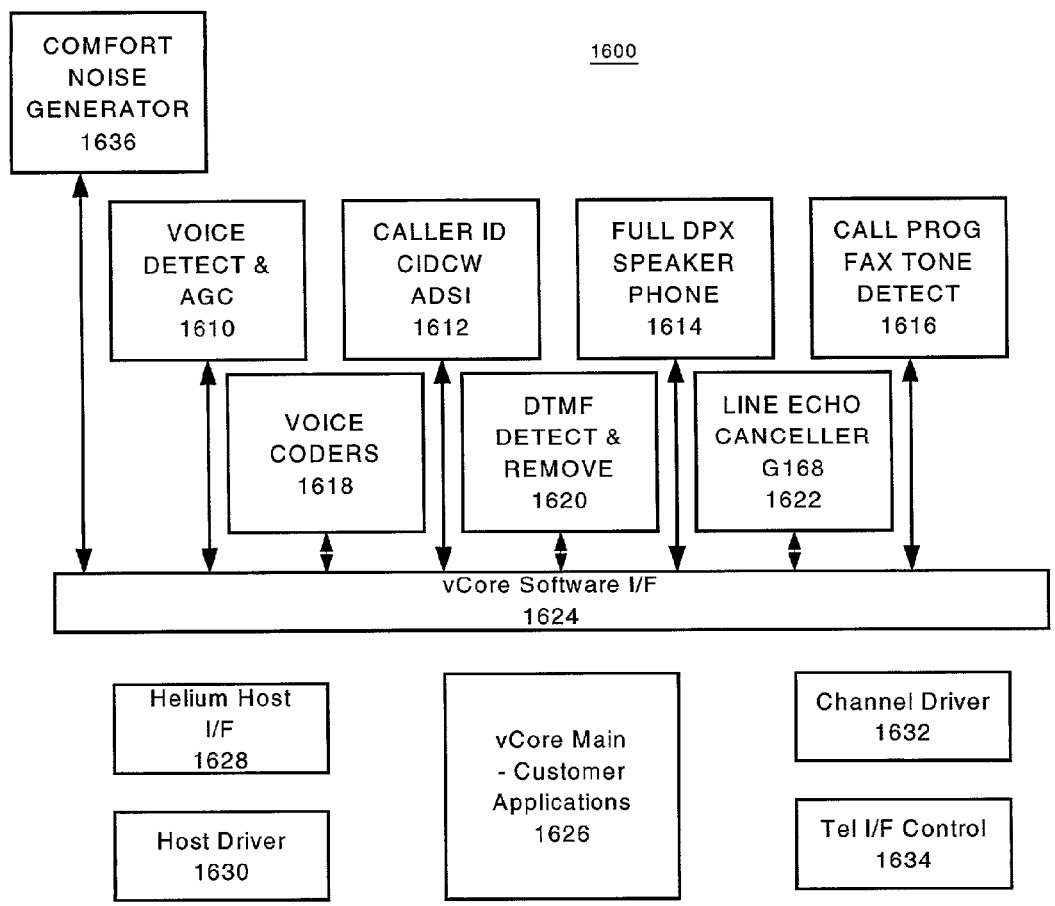
FIG. 16 is a schematic drawing of a software architecture in which the inventive aspects of the present invention may be incorporated.

The inventive concepts discussed above may be incorporated into Application-Specific Integrated Circuits (ASICs) or chip sets such as Virata Corporation's Magnesium™ DSP chip, which may be used in a wide variety of applications. FIGS. 15 and 16 illustrate a hardware/software architectures 1500 and 1600 in which the present invention may be incorporated. The system of FIG. 15 includes a protocol processor 1510, a network processor 1520, physical interface section 1530, and external device section 1540, as well as software to implement the desired functionality. As shown in FIG. 15, comfort noise generator functionality 1550 may be implemented as a voice algorithm or other software.

The system of FIG. 16 includes a software interface 1624, in communication with a variety of modules and/or applications, which may include a voice detection and automatic gain control (AGC) module 1610, a caller identifier on call waiting (CIDCW) analog display services interface (ADSI) module 1612, a full duplex speaker phone module 1614, a call progress fax tone detection module 1616, a voice coders module 1618, a Dual Tone Modulation (or Multi) Frequency (DTMF) detect and remove module 1620, and a line echo canceller module 1622. A comfort noise generator module 1636 may be provided, in accordance with the present invention. In addition, other functionality may be provided by customer applications 1626, a Helium™ host interface 1628, a host driver 1630, a channel driver 1632 and a telephone interface control 1634. Other applications, modules and functionality may also be implemented.

Virata's Magnesium™ voice software, vCore™, is an object and source code software library proven in hundreds of applications around the world. Based on an open, flexible, and modular software architecture, vCore™ enables a system designer to provide an optimized and efficient custom solution with minimal development and test effort. Software modules associated with vCore™ are available for a wide range of applications including telephony functions, network echo cancellers, fax/data functions, voice coders and other functions.

Telephony functions that may be incorporated in the system include: DTMF—Dual Tone Modulation (or Multi) Frequency generation and removal; MFD—Multi-Frequency Tone Detection; UTD—Universal Call Progress Tone Detection; FMTD—FAX and Modem Tone Detection Tone Generator—single, dual, and modulated; and VAGC—Voice Activity Detection with Automatic Gain Control. Network Echo Cancellers may include ITU G.168—multiple reflector (up to 128 ms tail) and ITU G.168—single reflector (up to 48 ms tail). Fax/Data functions that may be incorporated in the system include caller ID, caller ID with call waiting, fax relay of T.38 and I.366.2, High Level Data Link Control (HDLC) transmit/receive, and full-duplex speaker phone. Voice coders may include G.726, G.728— low delay coders; G.729, G.729A, G.729B, G.729AB, G.729E; G.723.1, G.723.1A; Global System for Mobile Communication GSM-EFR, GSM-AMR; G.722.1—audio coders; and proprietary coders.

Figure 17:
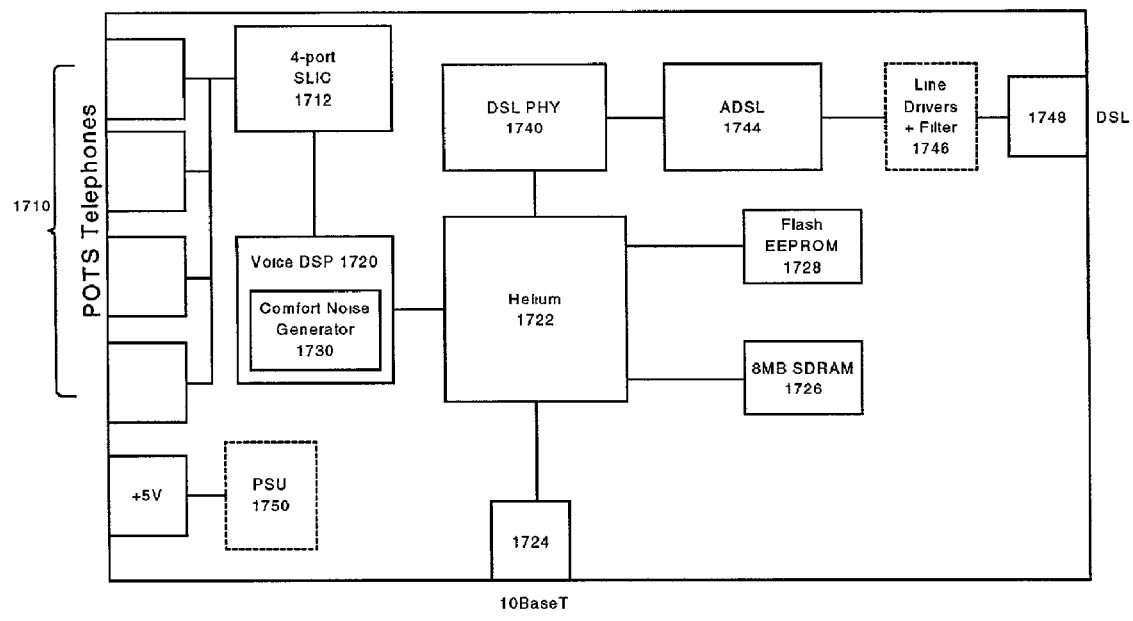
FIG. 17 is a schematic drawing of a hardware architecture in which the inventive aspects of the present invention may be incorporated.
Figure 18:
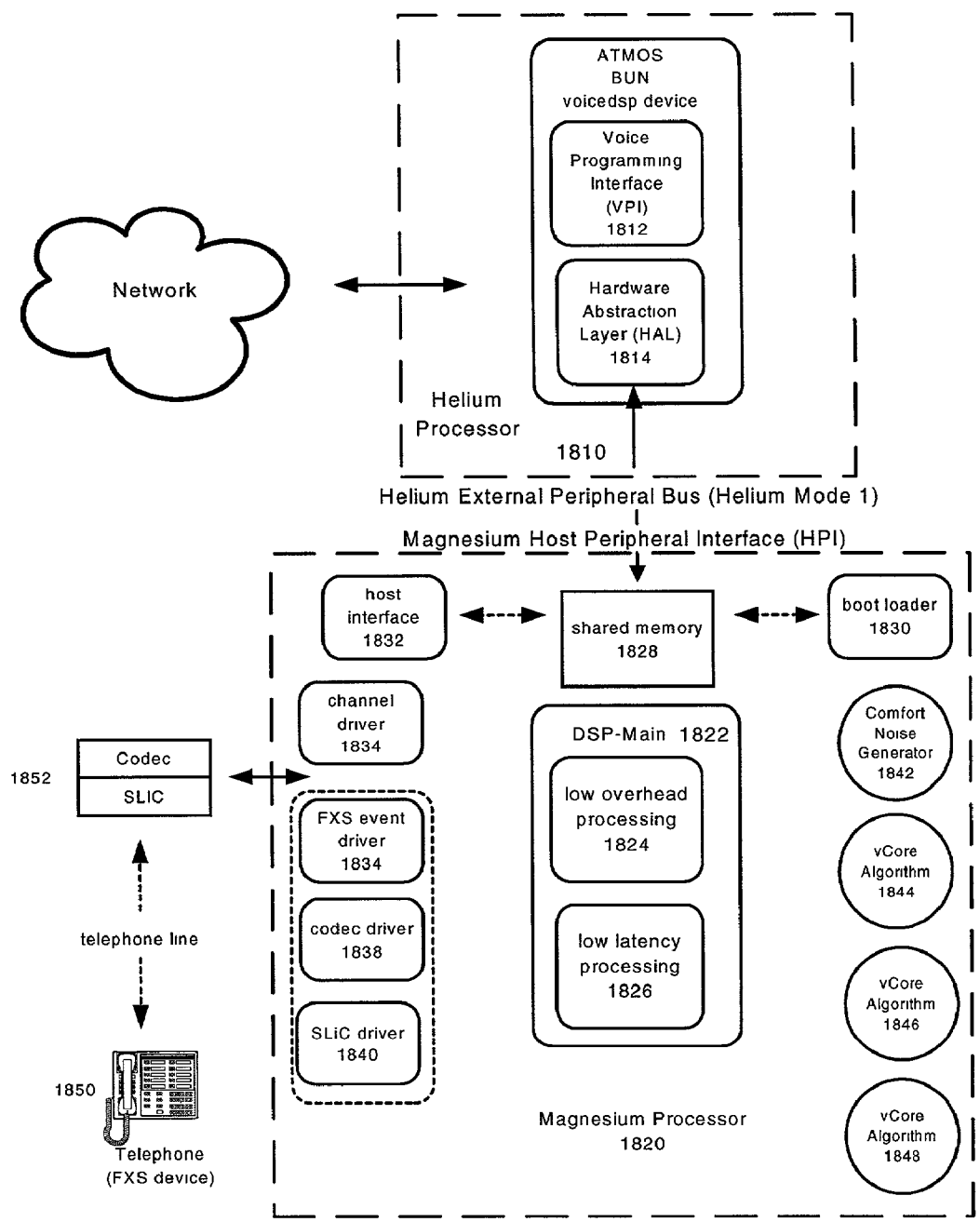
FIG. 18 is a schematic diagram of a hardware architecture in which the inventive aspects of the present invention may be incorporated.
Figure 19:
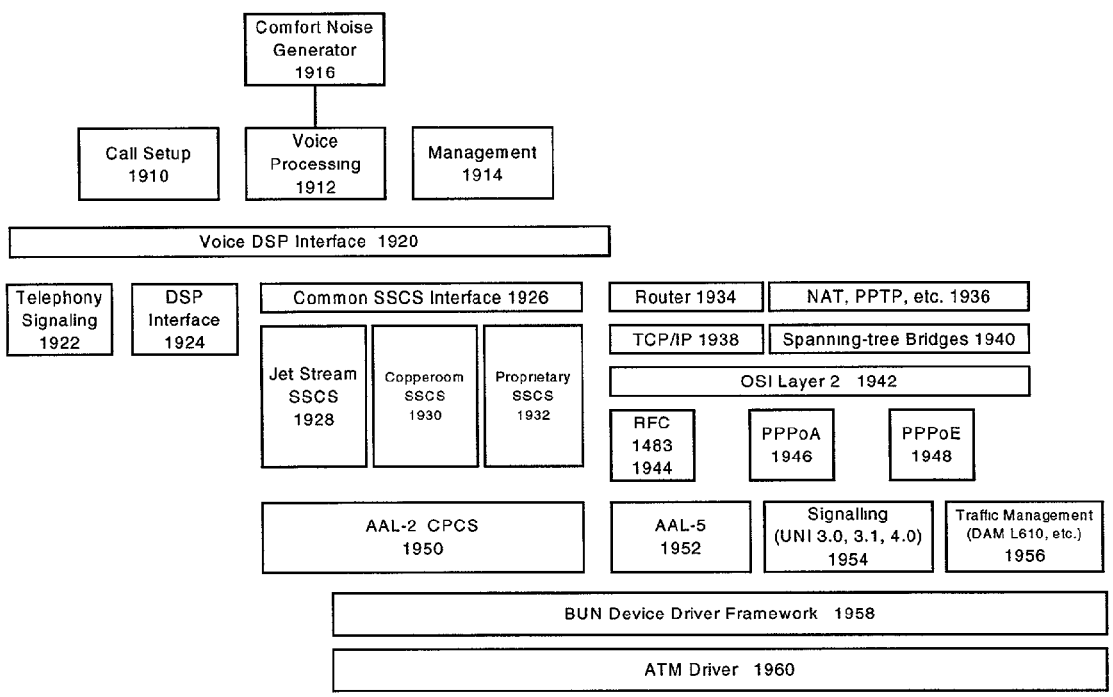
FIG. 19 is a schematic diagram of a software architecture in which the inventive aspects of the present invention may be incorporated.

Referring now to FIGS. 17–19, Voice-over-DSL integrated access devices (IADs) often require the integration of a broad range of complex technologies, including: Asynchronous Transfer Mode (ATM), packet, bridging, IP, and routing networking; real-time, toll-quality, voice traffic processing; voice encode/decode, echo cancellation, Dual Tone Modulation Frequency (DTMF) and other algorithms; and voice control and public-telephone-system interworking protocols. These technologies impose silicon and software requirements, and require a high degree of integration to achieve seamless operation.

Virata's Azurite™ chipsets, for example, are integrated voice and data solutions targeted at DSL Integrated Access Devices (IADs). These chipsets significantly increase performance, lower cost and speed time to market by integrating the Voice-over-DSL system components. Virata's Azurite™ 3000-series chipset features Virata's Magnesium™ DSP, Helium™ communications processor, and full software stack. Virata's PHY neutral Helium communications processor can be used with any external Digital Subscriber Line Physical Layer Device (DSL PHY), whether xDSL, Asymmetric Digital Subscriber Line (ADSL), Symmetric Digital Subscriber Line (SDSL), or other, making the 3000-series suitable for a broad range of DSL IADs. Virata's Azurite 4000-series chipset features Virata's Magnesium DSP, Beryllium communications processor, and full software stack. Virata's Beryllium communications processor includes a built-in ADSL PHY, enabling the 4000-series to achieve the very highest level of integration for ADSL IADs.

In one embodiment, the present invention may be incorporated in components used in DSL Central Office (CO) Equipment. CO equipment often comprises high performance processors with built-in peripherals and integrated communications protocol stacks directed to a variety of CO equipment applications. For instance, one possible application for the inventive solutions in Central Office/Digital Loop Carrier (CO/DLC) environments involves a Digital Subscriber Line Access Multiplexer (DSLAM) line card. For instance, Virata's Helium processor and ISOS software can be used to concentrate up to seven double-buffered (fast and interleaved path) ADSL ports or alternatively up to 13 single-buffered (interleaved path only) ports, assuming in both cases a double-buffered port facing upstream or connected to a backplane in DSLAM or miniSLAM applications. Helium's high speed UTOPIA 2 interface can support a variety of different DSL PHY devices (e.g., ADSL, SHDSL (single-line high-bit-rate digital subscriber line or symmetrical high-density digital subscriber line), etc. Multiple devices can be used together to support line cards with greater numbers of ports. Helium can be booted from either local memory or remotely from a central processor/memory.

The software provided may support a variety of Asynchronous Transfer Mode (ATM) functions such as Operations and Management (OAM), priority queuing, traffic shaping (constant bit rate (CBR), real time (rt)—variable bit rate (VBR), non real time (nrt)—VBR), policing (cell tagging) and congestion management (Early Packet Discard (EPD), Partial Packet Discard (PPD)). In the control plane, Helium comes with a Q.2931 call processing agent which sets up switched virtual circuits (SVCs) within which associate the assigned ATM label (Virtual Path Identifier/Virtual Channel Identifier (VPI/VCI)) to a physical T1 Wide Area Network (WAN) port. In the management plane, Helium comes with a simple network management protocol (SNMP) agent which can be used by Element Management to configure or monitor the performance of the module, for example, detecting out of service events due to link failure, maintaining and reporting cyclic redundancy check (CRC) error counts, etc.

In another example, Virata's Helium™ processor is used to support protocol conversion between ATM and Frame Relay. Such an adaptation could be used in a DSLAM or ATM switch to transport data to an Internet Service Provider (ISP), for example over a Frame Relay network. ATM cells from the switch backplane are received by Helium via the UTOPIA-2 interface and converted into an AAL-5 PDU (Protocol Data Unit). The resulting PDU is encapsulated into a HDLC header with a Data Link Connection Identifier (DLCI) to complete the conversion into Frame Relay. The process is reversed in the other direction as indicated in the protocol stacks diagram. In the control plane, Helium comes with a Q.2931 call processing agent which sets up SVCs within which associate the assigned ATM label (VPI/VCI) to a physical T1 WAN port. In the management plane, Helium comes with an SNMP agent which can be used by Element Management to configure or monitor the performance of the module, for example, detecting out of service events due to link failure, maintaining and reporting CRC error counts, etc.

In yet another example, Virata's Helium processor is used in the design of an Inverse Multiplexing over ATM (IMA) line card for an ATM edge switch or miniSLAM. Helium's UTOPIA 1/2 interface supports up to 14 separate devices. The software supports traffic management functions such as priority queuing, traffic shaping and policing. During congestion for example, low priority cells (Cell Loss Priority (CLP)=1) are either delayed or discarded to make room for high priority and delay intolerant traffic such as voice and video. Or alternatively, EPD (Early Packet Discard) may be invoked to discard all cells that belong to an error packet. In the control plane, Helium comes with a User Network Interface (UNI) 3.0/4.0 signaling stack for setting up and taking down SVCs. In the management plane, Helium comes with an SNMP agent and Telnet application that can be used by Element Management to configure or monitor the performance of the IMA module.

FIG. 17 illustrates an example of DSL Home/Office Routers and Gateways Hardware. As shown in FIG. 17, IAD 1700 includes standard telephony jacks 1710 whereby a standard telephone line is connected to a Voice DSP via a Codec/SLIC (Serial Line Interface Circuit) 1712. This may occur locally, such at a Private Branch Exchange (PBX) or Small Office/Home Office (SOHO) gateway as often used in home office and small business situations, or can occur remotely at a central office. The SLIC 1712, such as a four-port SLIC, may be connected to a Voice DSP 1720, which may support comfort noise generator functionality, as shown by 1730. The Voice DSP (e.g., Magnesium) 1720 and the higher level, such as ATM, information processing and packetization processor reside at the central office or at the PBX/gateway. Voice DSP 1720 may be connected to Helium 1722. Virata's Helium is a single chip, highly integrated ATM switching and layer 2/3 processing device. Helium™ further includes a network processor that controls the direct connections to Ethernet and Universal Serial Bus (USB), as well as other physical interfaces. For example, Helium 1722 may be connected to 10BaseT 1724, Synchronous Dynamic Random Access Memory (SDRAM) 1726, Electrically Erasable Programmable Read Only Memory (EEPROM) 1728, DSL PHY 1740, as well as other interfaces. DSL PHY 1740 may also be connected to ADSL 1744, which may be connected to Line Drivers and Filter 1746. An interface to DSL may be provided at 1748. In addition, a power supply unit may be provided at 1750, which may support +5 volts (V) or other amount.

The Voice DSP 1720 encodes/compresses the voice data and the silence portion of the signal may be deleted or compressed and encoded by a comfort noise generator function, as shown by 1730. After being processed for IP or DSL transmission or the like at the higher level processor, the compressed voice data is transmitted over the network to a receiver device where the information is decoded layer by layer and the data packets are ultimately decoded to extract voice data. A comfort noise generator may reside at the receiver station, such as at a Voice DSP, for decoding the silence portion of the signal based on data from the source, or, if the silence data has been deleted altogether, may reconstruct the noise data for insertion during the silence portion of the signal. This reconstructed noise data may be based on noise data detected or estimated from the voice data, from historical data, or from a stored profile or the like. By removing the silence data, the system affords savings in bandwidth. However, it is desired to avoid the sensation of the signal cutting in and out by reconstructing and inserting comfort noise data during the periods of silence.

Voice data compression and encoding can be accomplished using Virata's G.729-Annex B, and G.729A-Annex B, Conjugate-Structure Algebraic-Code-Excited Linear-Predictive (CS-ACELP) voice coder algorithms. Virata's G.729A-Annex B CS-ACELP voice coder algorithm module implements the ITU-T G.729-Annex A and Annex B voice coder standard. Annex B to G.729A defines a voice activity detector and comfort noise generator for use with G.729 or G.729A optimized for V.70 DSVD (Digital Simultaneous Voice and Data) applications. It compresses codec (coder/decoder) or linear data to 8 KBps code using the Conjugate-Structure Agebraic-Code-Excited Linear-Predictive Coding function. Virata's G.729-Annex B CS-ACELP voice coder algorithm module implements the ITU-T G.729-Annex B voice coder standard. Annex B to G.729A defines a voice activity detector and comfort noise generator for use with G.729 or G.729A optimized for V.70 DSVD applications. It compresses codec or linear data to 8 KBps code using the CS-ACELP coding algorithms.

As an alternative to the MIPS intensive G729 compression algorithms, the present invention allows for compression using G726 standard in combination with the Comfort Noise Generator (CNG) techniques described hereinabove. The CNG resides, for example, in a vCore™ software module on the voice DSP, such as Virata's Magnesium processor. The voice data is compressed and encoded and the packets are forwarded for higher level packetization layering and ultimately transmitted along a communication network. Upon reaching a destination receiver, the voice data is decoded and a CNG decodes the data and constructs or reconstructs noise information to be included with the voice information as has been herein described.

FIG. 18 illustrates a software architecture, according to an embodiment of the present invention. DSP-Main 1822 application may be implemented to handle system-level level data flow from an audio channel to a host processor via a host interface layer (HST). In particular, DSP-Main 1822 may support low overhead processing 1824 and low latency processing 1826, as well as other types of processing. A FXS driver 1836 (TFXS) handles state transitions and signal debouncing for the FXS event interface. The lower layers include device drivers for codec 1838, SLIC 1840, and a device driver 1834 for the audio channel (CNL). A boot loader 1830 may load the DSP image after startup. The system provides a combination of minimal overhead, minimal CPU utilization, minimal latency and ease of integration, among other features.

FIG. 18 illustrates Virata's Helium processor 1810 connected to Virata's Magnesium processor 1820, which is connected to a telephone 1850 or other device via Codec/SLIC 1852. Helium processor 1810 may support a voice programming interface 1812 as well as a hardware abstraction layer 1814. Other functionality may be supported by processor 1810. Magnesium processor 1820 may include share memory 1828, boot loader 1830, host interface 1832, various algorithms (e.g., comfort noise generator 1842) 1842–1848, various drivers (e.g., 1834–1840) as well as other functions.

FIG. 19 illustrates a DSL integrated access device software, according to an embodiment of the present invention. As shown in FIG. 19, voice DSP software may include call setup 1910, voice processing 1912, and management 1914. Other voice software may be provided. Comfort noise generator functionality, as shown by 1916, of the present invention may be supported by the voice processing function at 1912. Voice DSP Interface 1920 provides an interface between voice DSP software and communications processor software. Communications processor software may include telephony signaling 1922, DSP interface 1924, Common Service Specific Convergence Sublayer (SSCS) Interface 1926, Jet Stream SSCS 1928, Copperoom SSCS 1930, Proprietary SSCS 1932, Router 1934, Network Address Translation (NAT), Point to Point Tunneling Protocol (PPTP) 1936, Transmission Control Protocol on top of the Internet Protocol (TCP/IP) 1938, Spanning-tree bridge 1940, Open Systems Interconnection (OSI) Layer 2 1942, Request for Comments RFC 1944, Point to Point Protocol over ATM (PPPoA) 1946, Point to Point Protocol over Ethernet (PPPoE) 1948, ATM Adaptation Layer (AAL)-2 Common Part Convergence Sublayer (CPCS) 1950, ATM Adaptation Layer (AAL)-5 1952, Signaling 1954, Traffic Management 1956, Broadband Unified Framework (BUN) device driver framework 1958, ATM Driver 1960, and/or other functionality.

Data encapsulation functionality may be provided by various methods, including RFC 1483, as shown by 1944; PPPoA 1946 and PPPoE 1948, for example. Encapsulations, as well as the logical connections below them, may be treated generically. For example, encapsulations may be attached to the Spanning-tree bridge 1940 or IP router 1934. An end result may include the ability to easily route or bridge between ports with traditional packet interfaces and ports with encapsulations or simply between ports with encapsulations. RFC 1483, as shown by 1944, provides a simple method of connecting end stations over an ATM network. PPPoA 1946 enables user data to be transmitted in the form of IP packets. In one example, PPPoE 1948 encapsulation may be used to transport PPP traffic from a personal computer (PC) or other device to a DSL device over Ethernet and then over a DSL link using RFC 1483 encapsulation. A PPPoE relay agent may act as bridge for determining on which session locally originated PPPoE traffic belongs.

AAL-2 (e.g., 1950) may be used for transporting voice traffic. AALs may include at least two layers. A lower layer may include a CPCS for handling common tasks such as trailer addition, padding, CRC checking and other functions. An upper layer may include a SSCS for handling service specific tasks, such as data transmission assurance. AAL-5 (e.g., 1952) may provide efficient and reliable transport for data with an intent of optimizing throughput and perform other functions.

AAL 5 1952 is a type of ATM adaptation layer for defining how data segmentation into cells and reassembly from cells is performed. Various AALs may be defined to support diverse traffic requirements.

Signaling 1954 may provide a means for dynamically establishing virtual circuits between two points. Spanning-tree bridges 1940 may provide a transparent bridge between two physically disjoint networks with spanning-tree options. A spanning-tree algorithm may handle redundancies and also increase robustness.

BUN device driver framework 1958 provides a generic interface to a broad range of packet and cell-based hardware devices. BUN may be termed a device driver framework because it isolates hardware-independent functions from hardware-dependent primitives and, in doing so, simplifies device driver development, maintenance and debugging.

ATM Driver 1960 passes data between application software tasks and a physical ATM port, for example, ATM Driver 1960 may perform ATM cell segmentation and reassembly, AAL encapsulation, and multiplexes concurrent data streams.

While the foregoing description includes many details and specificities, it is to be understood that these have been included for purposes of explanation only, and are not to be interpreted as limitations of the present invention. Many modifications to the embodiments described above can be made without departing from the spirit and scope of the invention.

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breath and spirit of the present invention as disclosed herein.

The invention claimed is:

1. A method for implementing a spectrum estimation for comfort noise generation, the method comprising the steps of:

receiving an input noise component of a signal;
   approximating a spectrum of the input noise component using an algorithm over a period of time;
   detecting an absence of speech signals
   generating comfort noise based on the approximating step when the absence of speech signals is detected; and
   performing an internal check to ascertain that the input noise component is within approximately 6 dB of a noise floor;
   wherein the spectrum of the input noise component is substantially constant over the period of time.

2. The method of claim 1, wherein the step of approximating further comprises the step of: shaping the input noise to a spectrum of a predicted signal using an inverse predictor.

3. The method of claim 1, wherein approximating to at least one of noise spikes and speech segments is prevented.

4. The method of claim 1, wherein the algorithm is a least mean square algorithm.

5. The method of claim 1, wherein the algorithm is a leaky least mean square algorithm.

6. The method of claim 1, wherein the algorithm is a normalized least mean square algorithm.

7. The method of claim 1, wherein the algorithm is a linear predictive coding algorithm.

8. The method of claim 1, wherein the generated comfort noise is substantially uniform.

9. The method of claim 1, further comprising the step of:
normalizing the algorithm for making the approximating step substantially independent of signal amplitude variations.

10. The method of claim 1, further comprising the step of:
segregating filter parameter encoding into at least one reflection coefficients from the approximating step for transmitting at least one silence insertion descriptor.

11. The method of claim 10, wherein interoperability between systems is enhanced.

12. The method of claim 11, wherein MIPS and memory are efficiently utilized.

13. The method of claim 1, wherein the step of approximating further comprises the step of:
filtering the input noise component by a synthesis filter.

14. The method of claim 13, wherein the synthesis filter is defined as follows:

$$H(z) = \frac{1}{\sum_{i=0}^{M} w_i z^{-i}}$$

wherein M represents a number of taps, w represents a predictor coefficient and H is a function of variable z.

15. The method of claim 13, wherein the synthesis filter is a $10^{th}$ order synthesis filter.

16. The method of claim 1, wherein the step of approximating further comprises the steps of:
detecting noise between speech data;
adapting to the noise; and
creating silence insertion descriptors based on the adapting step when speech is inactive.

17. The method of claim 16, wherein the silence insertion descriptors are generated by converting at least one direct form coefficients to at least one reflection coefficients as represented by:

$$A_{m-1}(z) = \frac{[A_m(z) - B_m(z)k_m]}{[1 - k_m^2]} \quad m = M-1, M-2, \ldots, 1$$

$B_m(z) = z^{-m} A_m(z^{-1})$

18. The method of claim 16, wherein silence insertion descriptors are decoded by converting at least one reflection coefficients to direct form coefficients as represented by:

$$A_0(z) = B_0(z) = 1$$
$$A_m(z) = A_{m-1}(z) + z^{-1} B_{m-1}(z) k_m \quad m = 1, 2, \ldots, M-1$$
$$B_m(z) = z^{-m} A_m(z^{-1}) \quad m = 1, 2, \ldots, M-1$$

19. The method of claim 1, wherein the step of approximating further comprises the steps of:
detecting noise between speech data;
adapting to the noise; and
generating enhanced noise based on an average spectrum of the input noise component when speech is inactive.

20. A method for implementing a spectrum estimation for comfort noise generation, the method comprising the steps of:
receiving an input noise component of a signal;
approximating a spectrum of the input noise component using an algorithm over a period of time;
detecting an absence of speech signals;
generating comfort noise based on the approximating step when the absence of speech signals is detected; and
performing a variable precision calculation of a least mean square error and at least one least mean square coefficient to make the algorithm substantially independent of variations in noise levels;
wherein the spectrum of the input noise component is substantially constant over the period of time.

21. A system for implementing a spectrum estimation for comfort noise generation, the system comprising:
an encoder adapted to receive an input noise component of a signal for approximating a spectrum of the input noise component using an algorithm over a period of time;
a detector for detecting an absence of speech signals; and
a comfort noise generator for generating comfort noise based on the approximation of the spectrum when the absence of speech signals is detected;
wherein the spectrum of the input noise component is substantially constant over the period of time and
wherein an internal check is performed to ascertain that the input noise component is within approximately 6 dB of a noise floor.

22. The system of claim 21, wherein the encoder further shapes the input noise to a spectrum of a predicted signal using an inverse predictor.

23. The system of claim 21, wherein approximating to at least one of noise spikes and speech segments is prevented.

24. The system of claim 21, wherein the algorithm is a least mean square algorithm.

25. The system of claim 21, wherein the algorithm is a leaky least mean square algorithm.

26. The system of claim 21, wherein the algorithm is a normalized least mean square algorithm.

27. The system of claim 21, wherein the algorithm is a linear predictive coding algorithm.

28. The system of claim 21, wherein the generated comfort noise is substantially uniform.

29. The system of claim 21, the algorithm is normalized for making the approximation of the spectrum substantially independent of signal amplitude variations.

30. The system of claim 21, wherein filter parameter encoding into at least one reflection coefficients is segregated from the approximation of the spectrum for transmitting at least one silence insertion descriptor.

31. The system of claim 30, wherein interoperability between systems is enhanced.

32. The system of claim 31, wherein MIPS and memory are efficiently utilized.

33. The system of claim 21, further comprises a synthesis filter for filtering the input noise component.

34. The system of claim 33, wherein the synthesis filter is defined as follows:

$$H(z) = \frac{1}{\sum_{i=0}^{M} w_i z^{-i}}$$

wherein M represents a number of taps, w represents a predictor coefficient and H is a function of variable z.

35. The system of claim 33, wherein the synthesis filter is a $10^{th}$ order synthesis filter.

36. The system of claim 21, wherein the encoder further comprises:

a detector for detecting noise between speech data;

an adaptor for adapting to the noise; and silence insertion descriptor creator for creating silence insertion descriptors based on the adapting step when speech is inactive.

37. The system of claim 36, wherein silence insertion descriptors are generated by converting at least one direct form coefficients to at least one reflection coefficients as represented by:

$$A_{m-1}(z) = \frac{[A_m(z) - B_m(z)k_m]}{[1 - k_m^2]} \quad m = M-1, M-2, \ldots, 1$$

$B_m(z) = z^{-m} A_m(z^{-1})$

38. The system of claim 36, wherein silence insertion descriptors are decoded by converting at least one reflection coefficients to direct form coefficients as represented by:

$$A_0(z) = B_0(z) = 1$$

$$A_m(z) = A_{m-1}(z) + z^{-1} B_{m-1}(z)k_m \qquad m = 1, 2, \ldots, M-1$$

$$B_m(z) = z^{-m} A_m(z^{-1}) \qquad m = 1, 2, \ldots, M-1$$

39. The system of claim 21, wherein the encoder further comprises:

a detector for detecting noise between speech data;

an adaptor for adapting to the noise; and a noise generator for generating enhanced noise based on an average spectrum of the input noise component when speech is inactive.

40. A system for implementing a spectrum estimation for comfort noise generation, the system comprising:

an encoder adapted to receive an input noise component of a signal for approximating a spectrum of the input noise component using an algorithm over a period of time;

a detector for detecting an absence of speech signals; and a comfort noise generator for generating comfort noise based on the approximation of the spectrum when the absence of speech signals is detected;

wherein the spectrum of the input noise component is substantially constant over the period of time and wherein a variable precision calculation of a least mean square error and at least one least mean square coefficient is performed to make the algorithm substantially independent of variations in noise levels.

* * * * *